(12) United States Patent
Tanigawa et al.

(10) Patent No.: US 8,990,747 B2
(45) Date of Patent: Mar. 24, 2015

(54) LOGICAL VERIFICATION APPARATUS AND METHOD

(71) Applicant: Fujitsu Semiconductor Limited, Yokohama-shi, Kanagawa (JP)

(72) Inventors: Motoya Tanigawa, Setagaya (JP); Noriyuki Ikeda, Akishima (JP); Akiji Watanabe, Sendai (JP); Jun Tanowaki, Akiruno (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 14/244,483

(22) Filed: Apr. 3, 2014

(65) Prior Publication Data

US 2014/0304669 A1    Oct. 9, 2014

(30) Foreign Application Priority Data

Apr. 5, 2013  (JP) ................................. 2013-079691

(51) Int. Cl.
 *G06F 17/50* (2006.01)
(52) U.S. Cl.
 CPC .................................... *G06F 17/504* (2013.01)
 USPC ......................................... 716/106; 716/105

(58) Field of Classification Search
 USPC .................................................. 716/100–106
 See application file for complete search history.

(56) References Cited

U.S. PATENT DOCUMENTS

| 6,715,135 | B2 | 3/2004 | Abe | |
|---|---|---|---|---|
| 2007/0283303 | A1* | 12/2007 | Ohshima et al. | 716/5 |
| 2008/0209377 | A1* | 8/2008 | Kondo | 716/6 |
| 2009/0276740 | A1* | 11/2009 | Matsuda et al. | 716/5 |

FOREIGN PATENT DOCUMENTS

| JP | 11-161693 | 6/1999 |
|---|---|---|
| JP | 11-265980 | 9/1999 |
| JP | 2002-351939 | 12/2002 |
| JP | 2004-334795 | 11/2004 |

* cited by examiner

*Primary Examiner* — Binh Tat
(74) *Attorney, Agent, or Firm* — Staas & Halsey LLP

(57) ABSTRACT

A verification item extraction apparatus is disclosed that performs a priority determination process. Connection relationships pertinent to input/output are derived for each of logics in a verification subject circuit based on connection information acquired from description data in a storage part. A first priority for verifying the logics is determined based on the connection relationships being derived. Related I/Fs, which are related to inputs to the logics and are interfaces to an outside of the verification subject circuit, are extracted based on the connection information. Second priority for verifying the related I/Fs is determined based on the first priority.

9 Claims, 23 Drawing Sheets

FIG.12

```
module DUT(
input  I_CLK,
input  I_CPU_AC,
input  I_CPU_WR,
input  [27:0] I_CPU_ADDR,
input  [31:0] I_CPU_DATA,
output [31:0] O_CPU_DATA,
input  I_INIT,
input  I_SPEED,
output O_STATUS);

reg [31:0] cpu_data;

reg [31:0] config;
reg txenable;
reg txstart;
reg txmode;

reg reg_1;
reg reg_2;
reg reg_3;
reg reg_4;
   :
   :
reg reg_12;

wire A;
wire B;
wire C;
wire D;
   :
   :
wire K;
```

~32

```
always @( posedge I_CLK ) begin
  if (I_CPU_AC) begin
    if (I_CPU_WR) begin
      case (I_CPU_ADDR[15:8])
        00 : config   <= I_CPU_DATA;
        02 : txstart  <= I_CPU_DATA[0];
        03 : txmode   <= I_CPU_DATA[0];
      endcase
    end else begin   // !I_CPU_WR
      case (I_CPU_ADDR[15:8])
        01 : cpu_data[3] <= txenable;  ~201
      endcase
    end
  end
end assign O_CPU_DATA = cpu_data;

assign A = I_SPEED | config;

always @( posedge I_CLK ) begin
  reg_1 <= A;  ~202
end assign B = txenable & txstart;  ~203 always @( posedge I_CLK ) begin
  reg_2 <= B;  ~204
end
    :
    :
    :
endmodule
```

FIG.13

| FF FLAG | SIGNAL | INPUT SIGNAL | FF REPLACEMENT | SIGNAL AFTER DUPLICATION ELIMINATION |
|---|---|---|---|---|
| | Top.I_SPEED | (null) | – | – |
| | Top.I_INIT | (null) | – | – |
| FF | Top.regblk.config | (null) | – | – |
| FF | Top.regblk.txenable | (null) | – | – |
| FF | Top.regblk.txstart | (null) | – | – |
| FF | Top.regblk.txmode | (null) | – | – |
| | Top.A | Top.I_SPEED, Top.regblk.config | – | – |
| | Top.B | Top.regblk.txenable Top.regblk.txstart | – | – |
| | Top.C | Top.regblk.config Top.reg_2 | – | – |
| | Top.D | Top.regblk.txstart Top.regblk.txmode | – | – |
| | Top.E | Top.regblk.txmode Top.I_INIT | – | – |
| | Top.F | Top.D Top.E | (Top.regblk.txstart Top.regblk.txmode) (Top.regblk.txmode Top.I_INIT) | Top.regblk.txstart Top.regblk.txmode Top.I_INIT |
| FF | Top.reg_1 | Top.A | Top.I_SPEED, Top.regblk.config | – |
| FF | Top.reg_2 | Top.B | Top.regblk.txenable Top.regblk.txstart | – |
| FF | Top.reg_3 | Top.C | Top.regblk.config Top.reg_2 | – |
| FF | Top.reg_4 | Top.F | Top.regblk.txmode Top.regblk.txstart Top.I_INIT | – |
| | Top.G | Top.reg_4 | – | – |
| | Top.H | Top.reg_4 | – | – |
| | Top.I | Top.reg_4 | – | – |
| FF | Top.reg_5 | Top.G | Top.reg_4 | – |
| FF | Top.reg_6 | Top.H | Top.reg_4 | – |
| FF | Top.reg_7 | Top.reg_4 | – | – |
| FF | Top.reg_8 | Top.I | Top.reg_4 | – |
| | Top.J | Top.reg_1 Top.reg_3 | – | – |
| | Top.K | Top.reg_3 | – | – |
| FF | Top.reg_9 | Top.J | Top.reg_1 Top.reg_3 | – |
| FF | Top.reg_10 | Top.K | Top.reg_3 | – |
| FF | Top.reg_11 | Top.reg_8 | – | – |
| FF | Top.reg_12 | Top.reg_8 | – | – |
| | Top.O_STATUS | Top.reg_3 | – | – |

FIG.14

| FF FLAG | SIGNAL | INPUT SIGNAL (AFTER WIRE -> FF REPLACEMENT & DUPLICATION ELIMINATION) | APPEARANCE COUNT IN "INPUT SIGNAL" |
|---|---|---|---|
| FF | Top.regblk.config | (null) | 2 |
| FF | Top.regblk.txenable | (null) | 1 |
| FF | Top.regblk.txstart | (null) | 2 |
| FF | Top.regblk.txmode | (null) | 1 |
| FF | Top.reg_1 | Top.I_SPEED, Top.regblk.config | 1 |
| FF | Top.reg_2 | Top.regblk.txenable Top.regblk.txstart | 1 |
| FF | Top.reg_3 | Top.regblk.config Top.reg_2 | 2 |
| FF | Top.reg_4 | Top.regblk.txmode Top.regblk.txstart Top.I_INIT | 4 |
| FF | Top.reg_5 | Top.reg_4 | 0 |
| FF | Top.reg_6 | Top.reg_4 | 0 |
| FF | Top.reg_7 | Top.reg_4 | 0 |
| FF | Top.reg_8 | Top.reg_4 | 2 |
| FF | Top.reg_9 | Top.reg_1 Top.reg_3 | 0 |
| FF | Top.reg_10 | Top.reg_3 | 0 |
| FF | Top.reg_11 | Top.reg_8 | 0 |
| FF | Top.reg_12 | Top.reg_8 | 0 |

FIG.15

| FF FLAG | SIGNAL | INPUT SIGNAL (AFTER WIRE → FF REPLACEMENT & DUPLICATION ELIMINATION) | SIGNAL COUNT IN "INPUT SIGNAL" |
|---|---|---|---|
| FF | Top.regblk.config | (null) | 0 |
| FF | Top.regblk.txenable | (null) | 0 |
| FF | Top.regblk.txstart | (null) | 0 |
| FF | Top.regblk.txmode | (null) | 0 |
| FF | Top.reg_1 | Top.I_SPEED, Top.regblk.config | 2 |
| FF | Top.reg_2 | Top.regblk.txenable Top.regblk.txstart | 2 |
| FF | Top.reg_3 | Top.regblk.config Top.reg_2 | 2 |
| FF | Top.reg_4 | Top.regblk.txmode Top.regblk.txstart Top.I_INIT | 3 |
| FF | Top.reg_5 | Top.reg_4 | 1 |
| FF | Top.reg_6 | Top.reg_4 | 1 |
| FF | Top.reg_7 | Top.reg_4 | 1 |
| FF | Top.reg_8 | Top.reg_4 | 1 |
| FF | Top.reg_9 | Top.reg_1 Top.reg_3 | 2 |
| FF | Top.reg_10 | Top.reg_3 | 1 |
| FF | Top.reg_11 | Top.reg_8 | 1 |
| FF | Top.reg_12 | Top.reg_8 | 1 |

| FF FLAG | SIGNAL | INPUT SIGNAL (AFTER WIRE -> FF REPLACEMENT & DUPLICATION ELIMINATION) | PATH FROM RELATED I/F |
|---|---|---|---|
| FF | Top.regblk.config | (null) | |
| FF | Top.regblk.txenable | (null) | |
| FF | Top.regblk.txstart | (null) | |
| FF | Top.regblk.txmode | (null) | |
| FF | Top.reg_1 | Top.I_SPEED, Top.regblk.config | ←Top.I_SPEED<br>←Top.regblk.config |
| FF | Top.reg_2 | Top.regblk.txenable<br>Top.regblk.txstart | ←Top.regblk.txenable<br>←Top.regblk.txstart |
| FF | Top.reg_3 | Top.regblk.config<br>Top.reg_2 | ←Top.regblk.config<br>←Top.reg_2 ←Top.regblk.txenable<br>←Top.regblk.txstart |
| FF | Top.reg_4 | Top.regblk.txmode<br>Top.regblk.txstart<br>Top.I_INIT | ←Top.regblk.txmode<br>←Top.regblk.txstart<br>←Top.I_INIT |
| FF | Top.reg_5 | Top.reg_4 | ... |
| FF | Top.reg_6 | Top.reg_4 | |
| FF | Top.reg_7 | Top.reg_4 | |
| FF | Top.reg_8 | Top.reg_4 | |
| FF | Top.reg_9 | Top.reg_1<br>Top.reg_3 | |
| FF | Top.reg_10 | Top.reg_3 | |
| FF | Top.reg_11 | Top.reg_8 | |
| FF | Top.reg_12 | Top.reg_8 | |

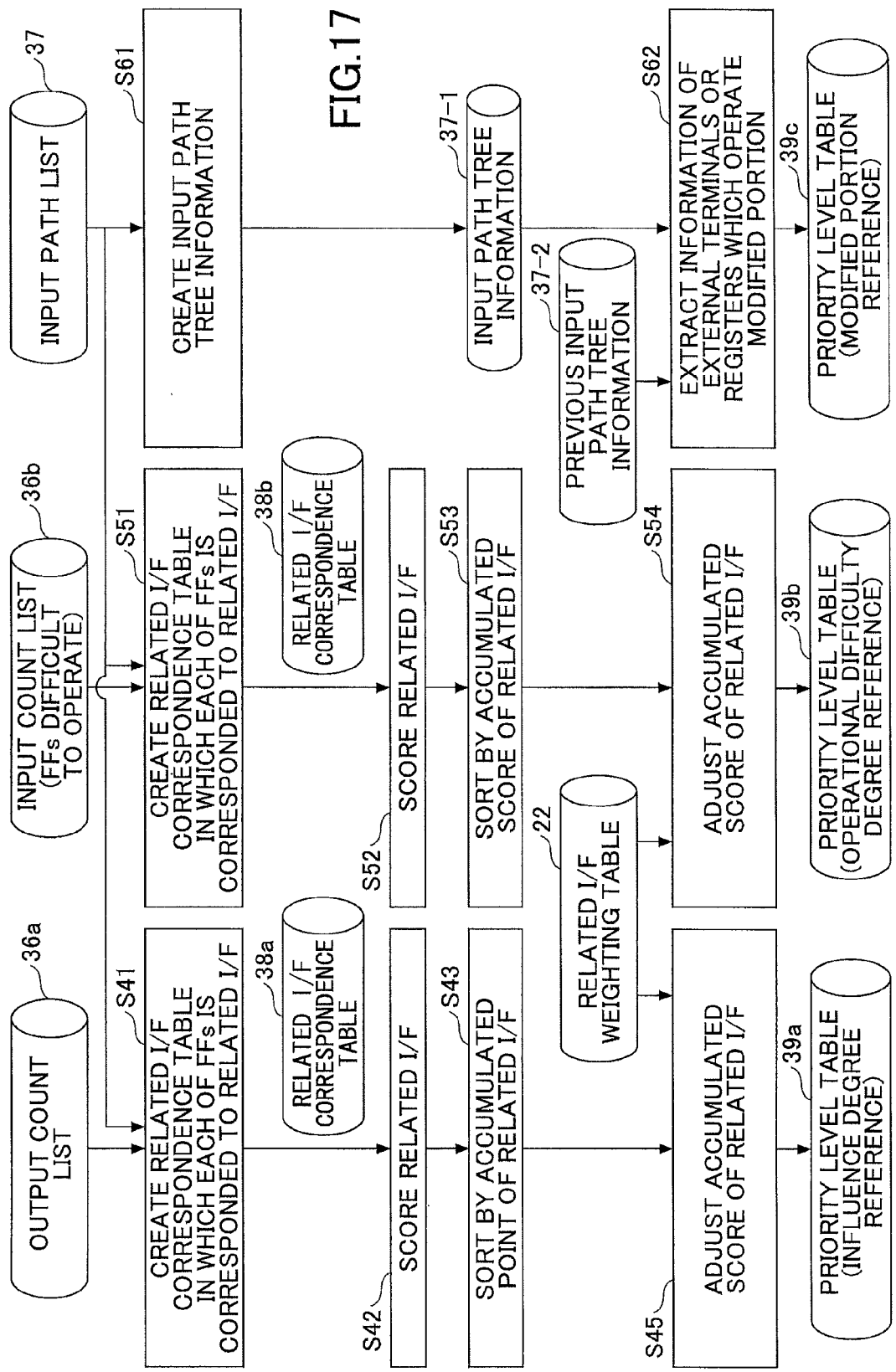

FIG.18

| FF FLAG | SIGNAL | APPEARANCE COUNT IN "INPUT SIGNAL" | RELATED I/F | SCORE OF RELATED I/F | ACCUMU-LATED SCORE |
|---|---|---|---|---|---|
| FF | Top.regblk.config | 2 | – | | |
| FF | Top.regblk.txenable | 1 | – | | |
| FF | Top.regblk.txstart | 2 | – | | |
| FF | Top.regblk.txmode | 1 | – | | |
| FF | Top.reg_1 | (1) | Top.I_SPEED | 1 | 1 |
| | | | Top.regblk.config | 1 | 1 |
| FF | Top.reg_2 | 1 | Top.regblk.txenable | 1 | 1 |
| | | | Top.regblk.txstart | 1 | (1) |
| FF | Top.reg_3 | (2) | Top.regblk.config | 2 | 3 |
| | | | Top.regblk.txenable | 2 | 3 |
| | | | Top.regblk.txstart | (2) | (3) |
| FF | Top.reg_4 | 4 | Top.regblk.txmode | 4 | 4 |
| | | | Top.regblk.txstart | (4) | (7) |
| | | | Top.I_INIT | 4 | 4 |
| FF | Top.reg_5 | 0 | ... | | |
| FF | Top.reg_6 | 0 | ... | | |
| FF | Top.reg_7 | 0 | ... | | |
| FF | Top.reg_8 | 2 | ... | | |
| FF | Top.reg_9 | 0 | ... | | |
| FF | Top.reg_10 | 0 | ... | | |
| FF | Top.reg_11 | 0 | ... | | |
| FF | Top.reg_12 | 0 | ... | | |

FIG.19

| RELATED I/F | ACCUMULATED POINT | WEIGHT | ADJUSTMENT VALUE |
|---|---|---|---|
| Top.regblk.txstart | 7 | 1.0 | 7.0 |
| Top.regblk.txmode | 4 | 1.0 | 4.0 |
| Top.regblk.txenable | 3 | 1.0 | 3.0 |
| Top.I_INIT | 4 | 0.7 | 2.8 |
| Top.regblk.config | 3 | 0.2 | 0.6 |
| Top.I_SPEED | 1 | 0.1 | 0.1 |
| ... | | | |

| FF FLAG | SIGNAL | SIGNAL COUNT IN "INPUT SIGNAL" | RELATED I/F | SCORE OF RELATED I/F | ACCUMU-LATED SCORE |
|---|---|---|---|---|---|
| FF | Top.regblk.config | 0 | – | | |
| FF | Top.regblk.txenable | 0 | – | | |
| FF | Top.regblk.txstart | 0 | – | | |
| FF | Top.regblk.txmode | 0 | – | | |
| FF | Top.reg_1 | 2 | Top.I_SPEED<br>Top.regblk.config | 2<br>2 | 2<br>2 |
| FF | Top.reg_2 | 2 | Top.regblk.txenable<br>Top.regblk.txstart | 2<br>2 | 2<br>2 |
| FF | Top.reg_3 | 2 | Top.regblk.config<br>Top.regblk.txenable<br>Top.regblk.txstart | 2<br>2<br>2 | 4<br>4<br>4 |
| FF | Top.reg_4 | 3 | Top.regblk.txmode<br>Top.regblk.txstart<br>Top.I_INIT | 3<br>3<br>3 | 3<br>7<br>3 |
| FF | Top.reg_5 | 1 | ... | | |
| FF | Top.reg_6 | 1 | ... | | |
| FF | Top.reg_7 | 1 | ... | | |
| FF | Top.reg_8 | 1 | ... | | |
| FF | Top.reg_9 | 2 | ... | | |
| FF | Top.reg_10 | 1 | ... | | |
| FF | Top.reg_11 | 1 | ... | | |
| FF | Top.reg_12 | 1 | ... | | |

FIG.21

| RELATED I/F | ACCUMU-LATED POINT | WEIGHT | ADJUSTMENT VALUE |
|---|---|---|---|
| Top.regblk.txstart | 7 | 1.0 | 7.0 |
| Top.regblk.txenable | 4 | 1.0 | 4.0 |
| Top.I_INIT | 3 | 0.7 | 3.0 |
| Top.regblk.txmode | 3 | 1.0 | 2.1 |
| Top.regblk.config | 4 | 0.2 | 0.8 |
| Top.I_SPEED | 2 | 0.1 | 0.2 |
| ... | | | |

FIG.22

| FF FLAG | SIGNAL | INPUT SIGNAL (FF AT 1st PRE-STAGE) | FF AT 2nd PRE-STAGE | 3rd PRE-STAGE |
|---|---|---|---|---|
| FF | Top.regblk.config | (null) | | |
| FF | Top.regblk.txenable | (null) | | |
| FF | Top.regblk.txstart | (null) | | |
| FF | Top.regblk.txmode | (null) | | |
| FF | Top.reg_1 | Top.I_SPEED(I/O) | | |
| | | Top.regblk.config(reg) | | |
| FF | Top.reg_2(#) | Top.regblk.txenable(reg) | | |
| | | Top.regblk.txstart(reg) | | |
| FF | Top.reg_3 | Top.regblk.config(reg) | | |
| | | Top.reg_2(LINK TO #) | Top.regblk.txenable(reg) | |
| | | | Top.regblk.txstart(reg) | |
| FF | Top.reg_4 | Top.regblk.txmode(reg) | | |
| | | Top.regblk.txstart(reg) | | |
| | | Top.I_INIT(I/O) | | |
| FF | Top.reg_5 | Top.reg_4 | ·(OMISSION)· | |
| FF | Top.reg_6 | Top.reg_4 | ·(OMISSION)· | |
| FF | Top.reg_7 | Top.reg_4 | ·(OMISSION)· | |
| FF | Top.reg_8 | Top.reg_4 | ·(OMISSION)· | |
| FF | Top.reg_9 | Top.reg_1 | Top.I_SPEED(I/O) | |
| | | | Top.regblk.config(reg) | |
| | | Top.reg_3 | Top.regblk.config(reg) | |
| | | | Top.reg_2 | Top.regblk.txenable(reg) |
| | | | | Top.regblk.txstart(reg) |
| FF | Top.reg_10 | Top.reg_3 | ·(OMISSION)· | |
| FF | Top.reg_11 | Top.reg_8 | ·(OMISSION)· | |
| FF | Top.reg_12 | Top.reg_8 | ·(OMISSION)· | |

VERIFICATION ITEM EXECUTION COUNT

LOGICAL VERIFICATION APPARATUS AND METHOD

CROSS-REFERENCE TO RELATED APPLICATIONS

This patent application is based upon and claims the benefit of priority of the prior Japanese Patent Application No. 2013-079691 filed on Apr. 5, 2013, the entire contents of which are incorporated herein by reference.

FIELD

The embodiment discussed herein is related to a logical simulation of a semiconductor integrated circuit.

BACKGROUND

Conventionally, a verification using a logical simulation has been conducted for a designed circuit. For the verification of the designed circuit, verification items are determined. Next, a priority of the verification items (an order to perform priority items) is defined. A scenario is created to instruct a logical simulation pattern in accordance with the priority of the verification items, and the logical simulation is executed.

The priority of the verification items is defined based on "items strongly recommended to verify". Especially, the "items strongly recommended to verify" correspond to items for verifying portions which may include bugs, or portions which may broadly influence other logics (logic circuits) due to modification of Register Transfer Level (RTL) when a bug is found.

Also, in general, when the bug is found by the verification using the logical simulation and the RTL is modified for the bug, the verification is performed again, in order to confirm modification contents and to confirm how the modification influences peripheral logics. In this re-verification, verification items, which activate a modified logic of the RTL, are also considered as the "items strongly recommended to verify".

In light of extracting portions which the modification influences, a method is considered in which a result output of an initial logical simulation is read out, and a cell where an error occurs in a circuit and a cell of a post-stage which is influenced by an output signal of the cell are determined. Another method may be considered in which by setting a register or an external output pin as a start point in a cell within circuit connection information after a circuit is modified, connection information of cells in the circuit connection information is traced back until reaching a register or an external input pin.

Also, regarding the priority for conducting the verification, a few technologies are proposed. In one technology, a signal transition confirmation verification is conducted with respect to a verification target portion in a circuit, verification test patterns or verification target portions are prioritized depending on a ratio of a signal transition, and the verification is conducted in an order based on the priority. In another technology, regarding an influence level for an operation of a logical circuit when an input signal is changed, a priority is defined for an input signal input into a logical circuit being a verification target.

PATENT DOCUMENTS

Japanese Laid-open Patent Publication No. H11-161693
Japanese Laid-open Patent Publication No. 2004-334795
Japanese Laid-open Patent Publication No. 11-265980
Japanese Laid-open Patent Publication No. 2002-351939

SUMMARY

According to one aspect of the embodiment, there is provided a verification item extraction apparatus, including: a processor; and a storage part configure to store description data which describe an operation of a verification subject circuit, wherein the processor performs a priority determination process including deriving connection relationships pertinent to an input/output for each of logics in the verification subject circuit based on connection information acquired from the description data in the storage part; determining a first priority for verifying the logics based on the connection relationships being derived; extracting related I/Fs, which are related to inputs to the logics and are interfaces to an outside of the verification subject circuit, based on the connection information; and determining a second priority for verifying the related I/Fs based on the first priority.

According to other aspects of the embodiment, there may be provided a verification item extraction method, and a recording medium thereof.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 12 is a diagram illustrating a RTL description example of the DUT;

FIG. 13 is a data example of an output table;

FIG. 14 is a diagram illustrating a data example of an output count list;

FIG. 15 is a diagram illustrating a data example of an input count list;

FIG. 16 is a diagram illustrating a data example of an input path list;

FIG. 17 is a flowchart for explaining a related I/F extraction process;

FIG. 18 is a diagram illustrating a data example of a related I/F correspondence table;

FIG. 19 is a diagram illustrating a data example of a priority table on the basis of an influence degree;

FIG. 20 is a diagram illustrating a data example of a related I/F correspondence table on the basis of the difficulty degree to operate;

FIG. 21 is a diagram illustrating a data example of a priority table on the basis of a difficulty degree to operate;

FIG. 22 is a diagram illustrating a data example of input path tree information on the basis of a modified portion.

DESCRIPTION OF EMBODIMENTS

In the above described technologies for extracting portions which modification influences when a Register Transfer Level (RTL) is modified for a bug, a priority of verification items is generally defined based on contents (input/output terminals, a register map, and operations of functions which are externally comprehended) which are described in a specification of a verification target circuit (Design Under TEST (DUT)) and related written standards as well as the verification items. Furthermore, a function to be verified, which is considered by a designer, may be reflected.

However, the specification is generally described in natural language, and may include unclear, insufficient, or redundant description. Moreover, there are many cases in which information inside the DUT has not been disclosed. Accordingly, more workload may be demanded to comprehend information for determining the priority of the verification items in the specification. Also, the determined priority may be analogized from the information. Hence, the certainty of the determined priority may be limited.

Accordingly, in embodiments described below, technologies will be presented to effectively set the priority of the verification items by using the logical simulation of a semiconductor integrated circuit.

In the following, the embodiments of the present invention will be described with reference to the accompanying drawings.

In a circuit verification using the logical simulation (hereinafter, called "logical simulation verification"), even in a case of conducting verification (hereinafter, called "logical simulation verification") by the logical simulation based on the priority of the verification items (hereinafter, called "verification item priority") so as to conduct verification from the "items strongly recommended to verify", a bug having a broad influence may be detected at a later part of a verification operation in practice. The verification item priority, which is defined based on specification and the written standards, may not be sufficiently precise.

The verification item priority is determined based on various sets of information which are acquired outside the DUT of the specification, and the written standards. However, an actual "logical simulation verification" is changed depending on characteristics inside the semiconductor integrated circuit, such as a logical structure and the like.

Figure 1:
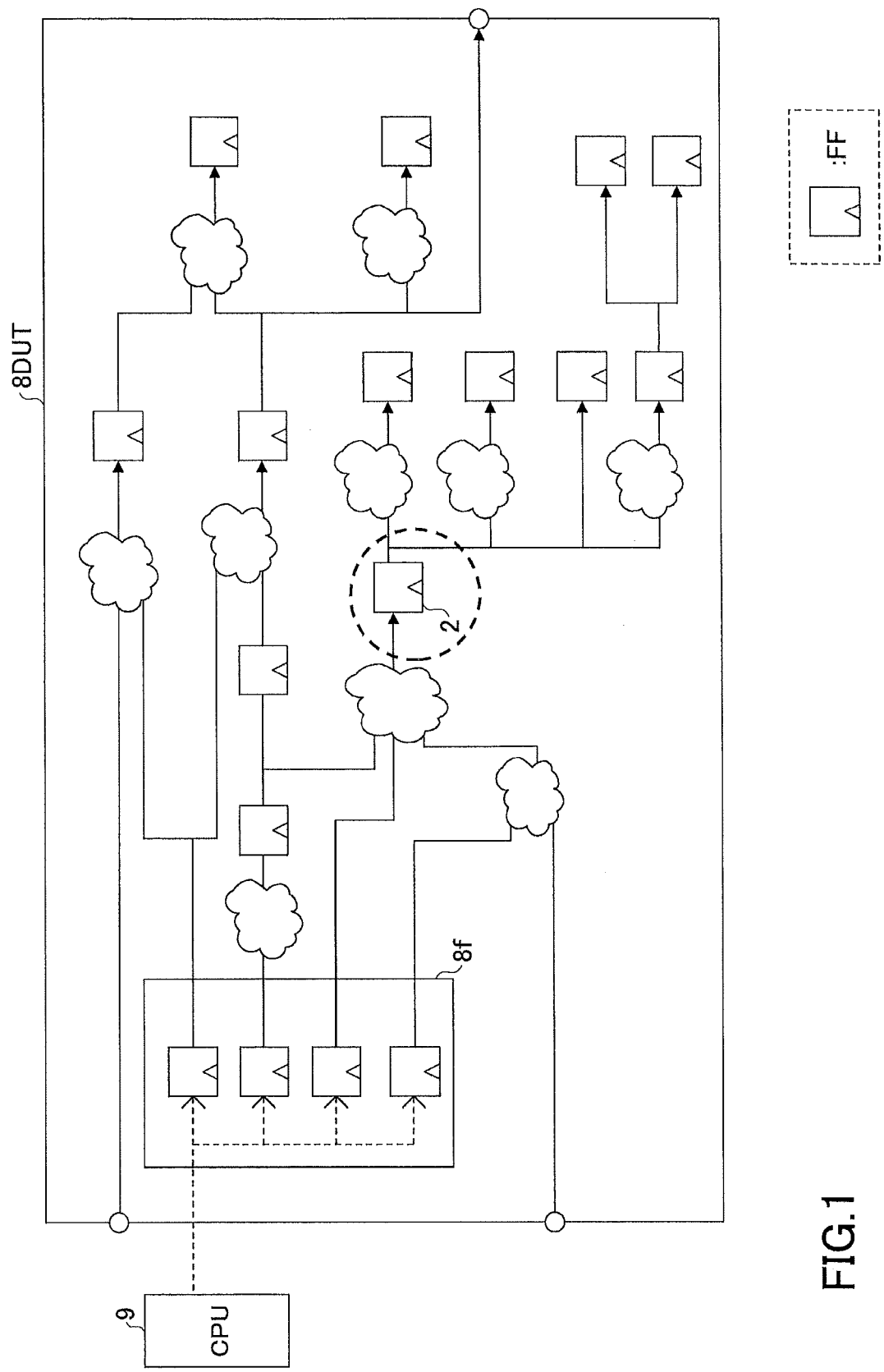
FIG. 1 is a diagram illustrating a circuit configuration example of a verification subject circuit.

In a certain logic (specifically, a register (Flip Flop (FF))), the logic is connected to multiple logics (FFs) at a post-stage of the logic. A portion of a structure being referred to may broadly influence the enter circuit if the portion is modified. Moreover, for a logic which connects from multiple logics at a pre-stage and has multiple inputs, a large variety of input conditions are applied. Hence, it is difficult to operate the logic. For this case, in a DUT 8 being the verification target circuit illustrated in FIG. 1, a FF 2 is considered as a portion having the broad influence, since there are multiple Flip Flops (FFs) to which the FF 2 is connected at the post-stage.

It is preferable to set the priority of the verification item testing this portion to be higher. However, the information may not be acquired from a user, the written standards, and the like.

Also, when the verification item priority is discussed, an opinion may be acquired from a designer, regarding information of the portion which the designer considers as a function to be verified or a structurally weak portion. Even in this case, if the designer may be convinced himself, items of higher priority may be missed.

Moreover, in a case in which a RTL modification is performed, there is a case in which a function other than a modification subject may be influenced. This influence may depend on a circuit description. It may be difficult to determine the influence from information of an external part of the DUT 8. As a result, even if a verification item is one to be set as higher priority, the verification item may be missed.

Due to the above described problem, the inventors consider the following factors when they determine the priority of the verification items.

(A1) The priorities of the verification items are not defined based on the information acquired from the specification alone and the like which are written in natural language.

(A2) Based on an internal structure of the DUT 8, a verification for a FF having logics at the post-stage is decided on as a verification item of the higher priority (hereinafter, called "priority item"). A portion tested by this verification item may be regarded as a portion which broadly influences the DUT 8 by being modified or as a portion which demands more time of the logical simulation since it is difficult to be operated. In the DUT 8 depicted in FIG. 1, it is preferable to extract the FF 2 and the like as the priority items.

(A3) When the DUT is modified, a modified FF and an item operating the modified FF are extracted as the priority items. In the DUT 8 depicted in FIG. 1, in a case of modifying the FF 2, a pre-portion of the FF 2 is regarded as a portion operating the FF 2, so it is preferable to extract the pre-portion as the priority item.

Regarding the above factors (A1) to (A3), the inventors have focused on extracting information which is to be an indicator of the priority of the verification items from the RTL. Specifically, the following portions may be pointed out as the "items strongly recommended to verify" which are extracted from the RTL.

(B1) Portion Having the Broad Influence if Modified

That is, a portion where a FF output is used by multiple FFs at the post-stage corresponds to this portion (B1). The FF, of which a sufficient operation is demanded to verify an influence on the multiple FFs at the post-stage, is a subject to extract from the RTL.

(B2) Portion for which Multiple Verification Items are Prepared for the Logical Simulation Verification to Intensively Verify That is, a portion, which demands a complicate condition to operate, corresponds to this portion (B2). The FF, which may be hardly operated due to a complicated operational condition, is a subject to extract from the RTL.

(B3) Portion being Modified

The FF, for which a sufficient operation is demanded to verify the influence on peripheral logics (registers (FFs)) since the RTL is modified, is a subject to extract from the RTL.

Schemes for extracting the above portions (B1) to (B3) will be considered below. If the portions (B1) to (B3) are extracted, information to extract is regarded as signal information defined in the RTL. Hence, the extracted information is not associated with any of the verification items which are based on a description externally defined with respect to the DUT 8.

Accordingly, in the embodiment, in order to associate the extracted information with the verification items, external input/output terminals associating with the signal information extracted from the RTL and the FFs of a user interface (I/F) 8*f* are derived. A list of the external input/output terminals and the FFs is created and displayed.

Figure 2:
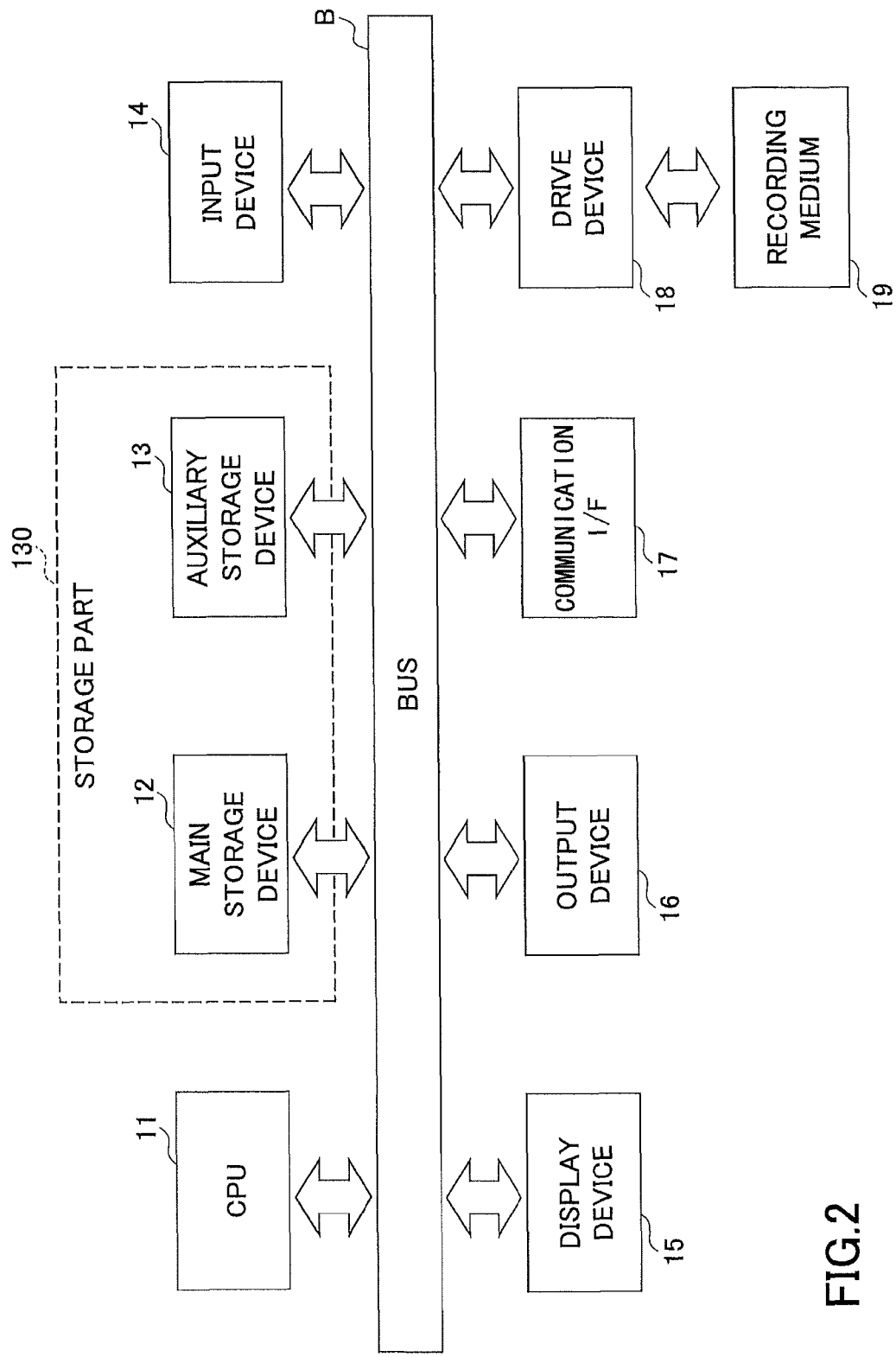
FIG. 2 is a diagram illustrating a hardware configuration of a logical verification apparatus.

A logical verification apparatus 100 according to the embodiment includes a hardware configuration as depicted in FIG. 2. FIG. 2 is a diagram illustrating the hardware configuration of the logical verification apparatus 100. In FIG. 2, the logical verification apparatus 100 corresponds to a terminal controlled by a computer, and includes a processor such as a Central Processing Unit (CPU) 11, a main storage device 12, an auxiliary storage device 13, an input device 14, a display device 15, an output device 16, a communication interface (I/F) 17, and a drive device 18, which are mutually connected via a bus B.

The CPU 11 controls the logical verification apparatus 100 in accordance with a program stored in the main storage device 12. The main storage device 12 may include a Random Access Memory (RAM), a Read-Only Memory (ROM), and the like, and stores the program executed by the CPU 11, data used in a process conducted by the CPU 11, data acquired in the process conducted by the CPU 11, and the like. Also, a part of an area of the main storage device 12 may be assigned as a working area used for the process conducted by the CPU 11.

The auxiliary storage device 13 may include a hard disk drive, and stores programs and data to conduct various processes. When the CPU 11 is instructed to execute the program, a part of the program being stored in the auxiliary storage device 13 is loaded to the main storage device 12. The CPU 11 realizes various processes by executing the program. The storage part 130 may correspond to the main storage device 12 and/or the auxiliary storage device 13.

The input device 14 may include a mouse, a keyboard, and the like. The input device 14 is used by the user to input various sets of information for the process conducted in the logical verification apparatus 100. The display device 15 displays various sets of information under control of the CPU 11. The output device 16 may include a printer and the like. The output device 16 outputs various sets of information in response to an instruction of the user. The communication I/F 17 may connect to an Internet, a Local Area Network (LAN), or the like. The communication I/F 17 is regarded as a device which controls communications between the logical verification apparatus 100 and external devices. The communication by the communication I/F 17 is not limited to wireless or wired communication.

The program, which realizes the process conducted by the logical verification apparatus 100, may be provided to the logical verification apparatus 100 by a recording medium 19 such as Compact Disc Read-Only Memory (CD-ROM) or the like. The recording medium 19 may be formed by a non-transitory (or tangible) computer-readable recording medium. The program stored in the recording medium 19 is installed into the auxiliary storage 13 of the logical verification apparatus 100. The program installed into the auxiliary storage 13 is executable by the logical verification apparatus 100.

The recording medium 19 storing the program is not limited to the CD-ROM. Any computer-readable medium may be used as the recording medium 19. As the computer-readable recording medium, a portable recording medium such as a Digital Versatile Disk (DVD), a Universal Serial Bus (USB) memory, and a semiconductor memory such as a flash memory may be used as well as the CD-ROM.

The logical verification apparatus 100 according to the embodiment performs a process including:

(a) extracting the "items strongly recommended to verify" based on connection information of the FF by referring to the description of the RTL (priority portion extraction), and (b) tracing back a connection at an input side of a signal for each of logics in the RTL which are extracted in the above procedure (a), extracting relationships with the external input/output terminals and the FF of the user I/F 8*f* which is the register accessed by the CPU 9, and listing the relationships in accordance with the priority (related I/F extraction).

A priority portion extraction process in the above procedure (a) will be described. The "items strongly recommended to verify" may correspond to portions described below.

(a-1) FF, to which the sufficient operation is demanded to verify the influence to other FFs at the post-stage since the FF output is used by the multiple FFs, is a subject FF.

Specifically, the FFs at a first post-stage of the subject FF are counted for each of the subject FFs. The subject FFs are listed in a descending order of a count of the FFs at the first post-stage.

Figure 3:
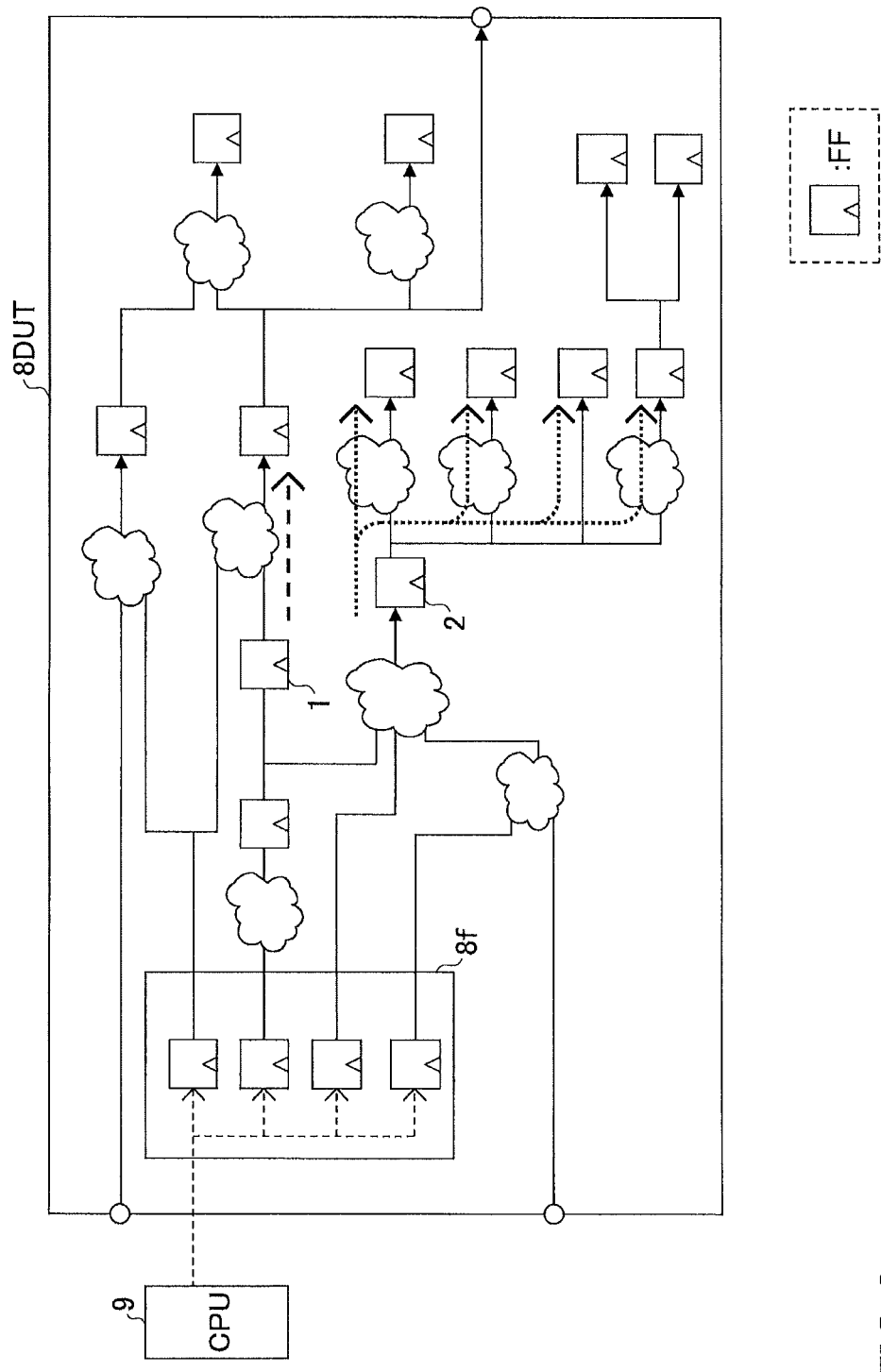
FIG. 3 is a diagram illustrating a count comparison of FFs at a first post-stage.

FIG. 3 is a diagram illustrating a count comparison of the FFs at the first post-stage. As illustrated in FIG. 3, a value of a FF 1 is used by only one FF at the post-stage. On the contrary, a value of the FF 2 is used by four FFs at the post-stage. Hence, the FF 2 influences the FF at the post-stage more than does the FF 1.

(a-2) FF, which is not operated less frequently due to the complicated operation conditions, is the subject FF.

Specifically, signals from a pre-stage, which combine FF inputs corresponding to a condition count, are counted. The subject FFs are listed in the descending order of a number of the signals.

Figure 4:
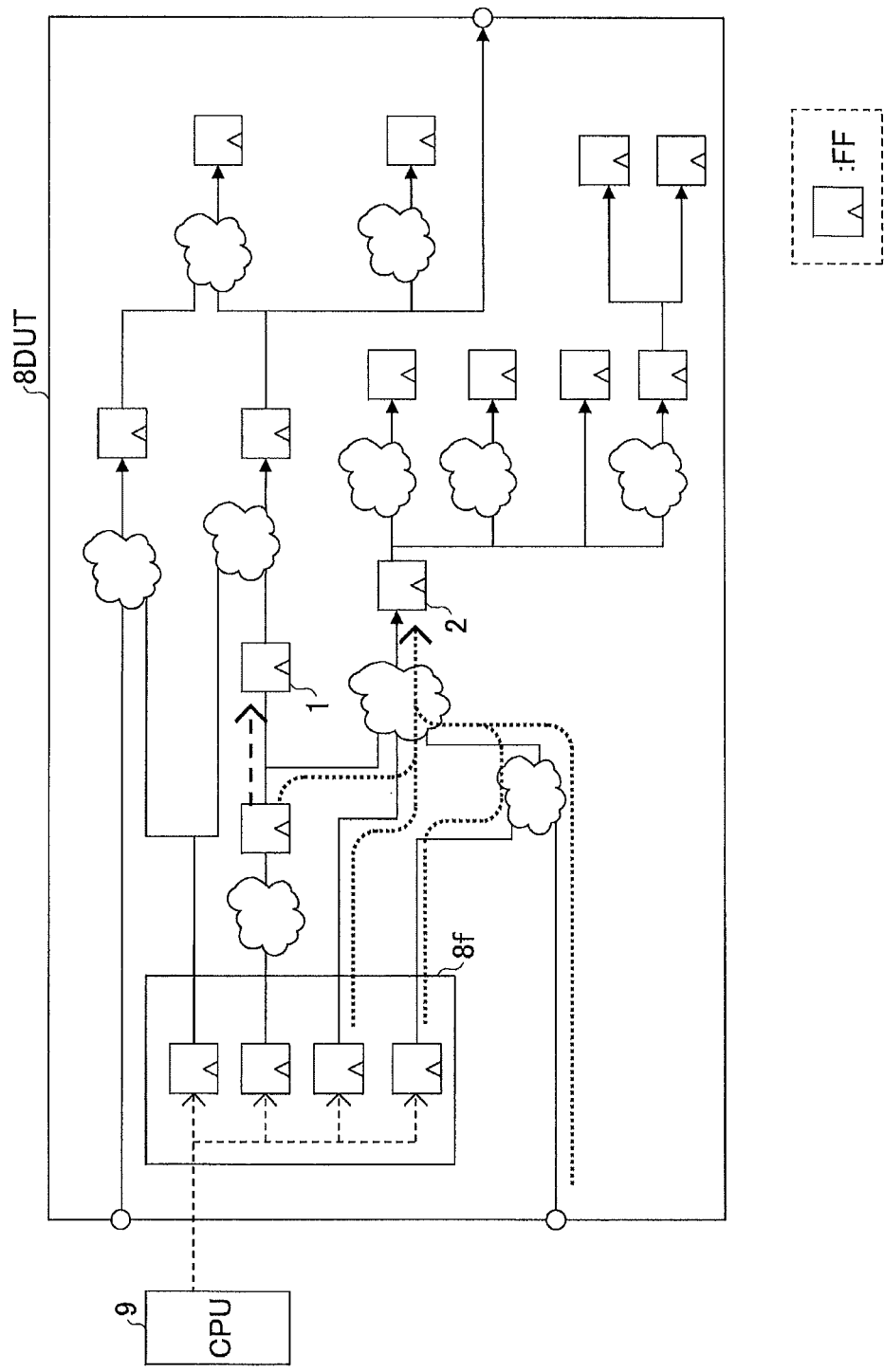
FIG. 4 is a diagram illustrating a comparison of a number of the FFs at a first pre-stage.

FIG. 4 is a diagram illustrating a comparison of a number of the FFs at a first pre-stage. As illustrated in FIG. 4, the value of the FF 1 is changed by an input signal value. The value of the FF 2 is changed when four input signal values correspond to a combination condition. Hence, the condition to change the value of the FF 2 is complicated more than that to change the value of FF 1.

(a-3) FF, which is demanded to frequently operate in order to verify the influence to the peripheral logics due to the modification of the RTL. Specifically, a first set of information before the modification and a second set of information after the modification are compared. The first set of information may indicate FFs being operated (hereinafter, may be called "operated FFs"), FFs of the user I/F 8*f* driving each of the FFs (hereinafter, may be called "driving FFs"), and input signals before the modification. The second set of information may indicate the operated FFs, the driving FFs, and the input signals after the modification.

Figure 5:
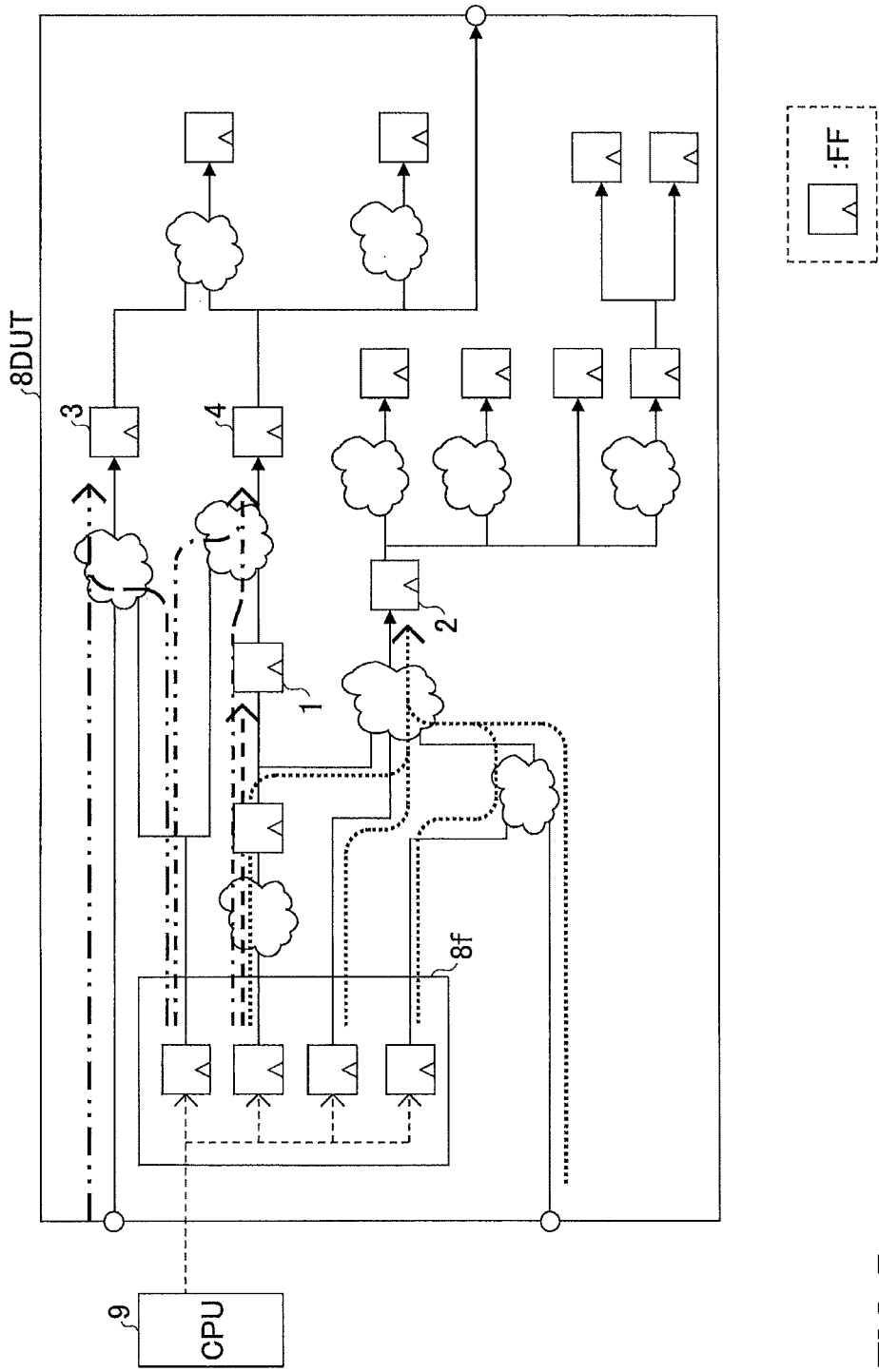
FIG. 5 is a diagram illustrating an example of signal paths which may drive the FFs.

FIG. 5 is a diagram illustrating an example of signal paths which may drive the FFs. As illustrated in FIG. 5, for the FF 1 to FF 4, the signal paths are specified based on the input signals which may drive the FF 1 to FF 4 and the driving FFs of the user I/F 8*f*. The signal paths are specified for all FFs including the FF 1 to FF 4, and a signal path tree is created. By comparing the signal path tree before the modification and the signal path tree after the modification with each other, it is determined that modified FFs, the input signals driving the modified FFs, and the driving FFs of the user I/F 8*f* are the priority items.

A related I/F extraction process pertinent to the above procedure (b) will be described. For each of logics in the RTL which are extracted by the priority portion extraction process pertinent to the above procedure (a), by tracing back connections from the input side of the signal, the relationships between the external input terminals and the driving FFs of the user I/F 8*f* are extracted. The FFs are counted in the priority portion extraction process pertinent to the above procedure (a), and are listed in the descending order of a count result.

Specific input signal information of the driving FFs of the user I/F 8*f*, which are reached by tracing back, may be acquired in the following manner.

(b-1) A list of signal information is given externally.

(b-2) An offset value is externally given for a register address, and an automatic extraction is conducted by using the offset value. Specifically, a read and write operation is exhaustively performed for register addresses beginning from the offset value. This manner (b-2) specifies from which FF a value is read and from which FF the value is written, from the description of the RTL. The FFs being specified are listed.

Figure 6:
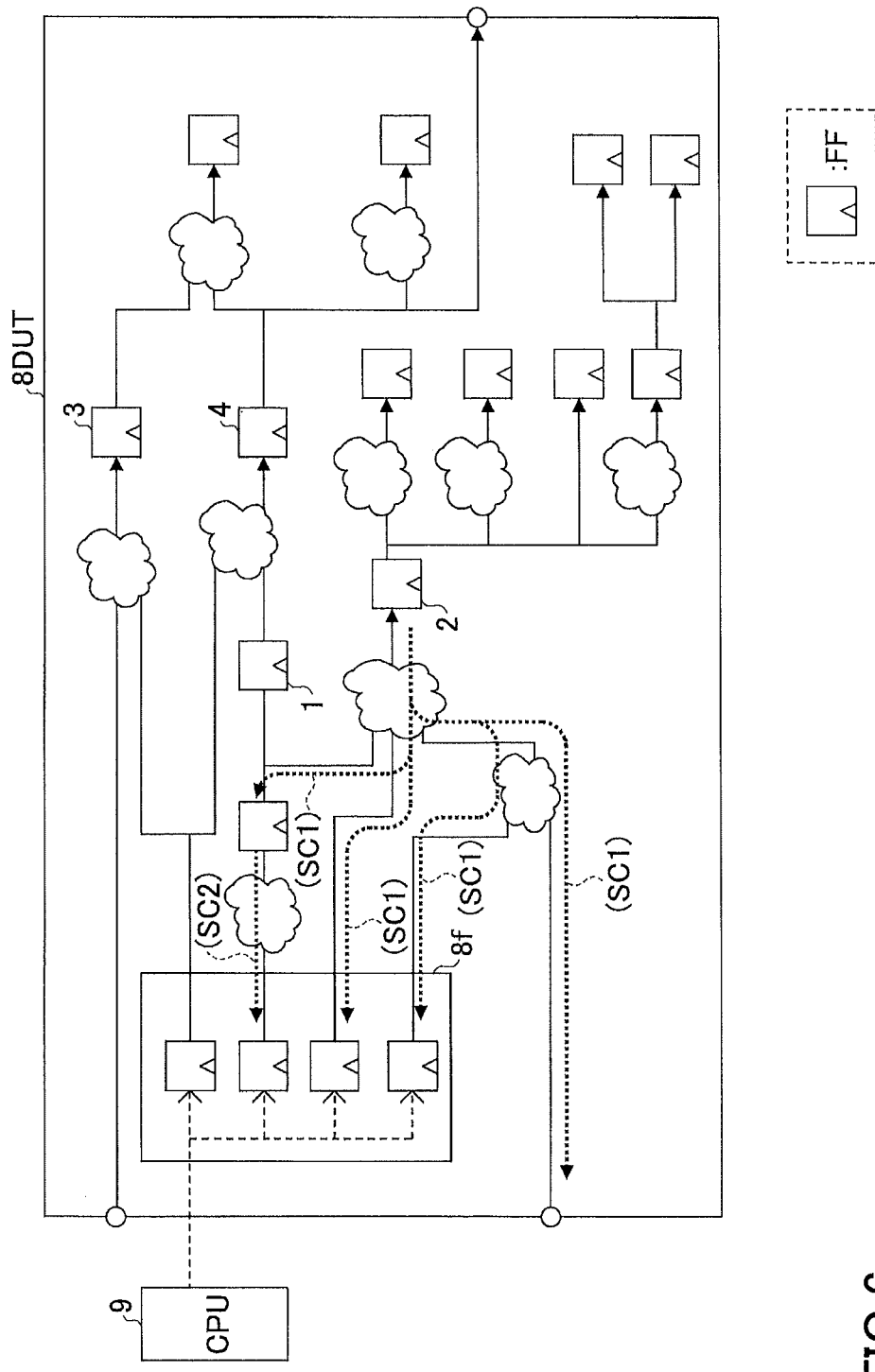
FIG. 6 is a diagram illustrating a backtrace example based on input signals.

FIG. 6 is a diagram illustrating a backtrace example based on the input signals. In FIG. 6, the FFs (or the external input signals) connected to the input side of the FF 2 are searched for at a first pre-stage (step SC1). Next, if a searched signal is not the external input signal or the driving FF of the user I/F 8*f*, a further search is performed for the FFs at the input side. This operation is repeated. When all signals being traced back reach the external input signal or the driving FFs of the user I/F 8*f*, the backtrace is completed (step SC2).

Figure 7:
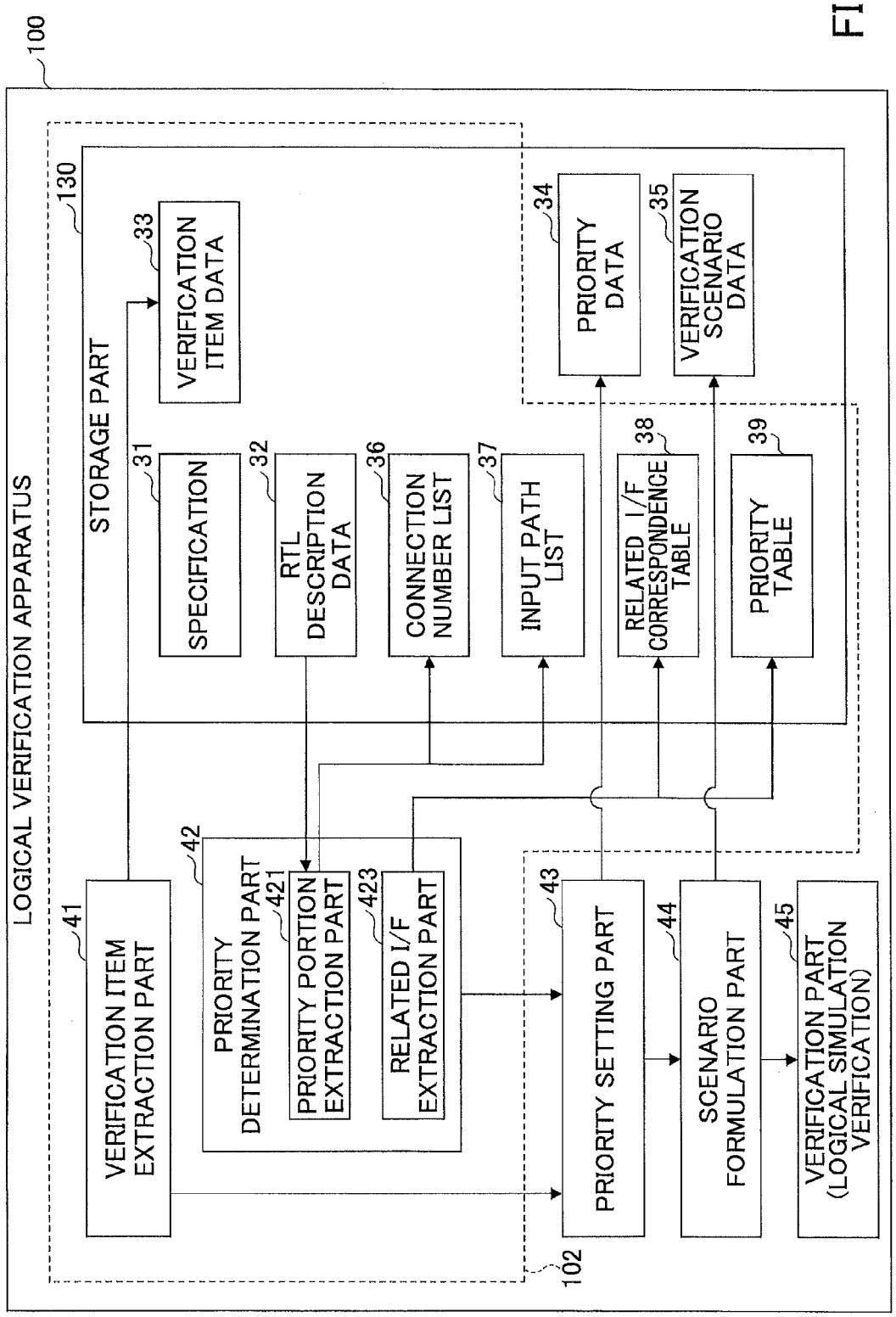
FIG. 7 is a diagram illustrating a functional configuration example of the logical verification apparatus.

FIG. 7 is a diagram illustrating a functional configuration example of the logical verification apparatus 100. In FIG. 7, the logical verification apparatus 100 includes a verification item extraction part 41, a priority determination part 42, a priority setting part 43, a scenario formulation part 44, and a verification part 45. The verification item extraction part 41, the priority determination part 42, the priority setting part 43, the scenario formulation part 44, and the verification part 45 are realized by processes performed by the CPU 11 executing respective programs.

The storage part 130 stores a specification 31, RTL description data 32, verification item data 33, priority data 34, verification scenario data 35, a connection number list 36, an input path list 37, a related I/F correspondence table 38, a priority table 39, and the like.

The verification item extraction part 41 aids a verifier to create the verification items by referring to the specification 31 being written in natural language. The verification items created by the verifier are stored in the logical verification apparatus 100.

The priority determination part 42 provides the verifier the priority table 39 in which interface portions corresponding to the "items strongly recommended to verify" are listed in a priority order of the verification by referring to the RTL description data 32 from the storage part 130.

The priority determination part 42 further includes a priority portion extraction part 421, and a related I/F extraction part 423. The priority portion extraction part 421 extracts the "items strongly recommended to verify" in the DUT 8 from the RTL description data 32. The related I/F extraction part 423 extracts related I/Fs respective to the "items strongly recommended to verify" extracted by the priority portion extraction part 421, and lists the related I/Fs in accordance with the priority. The related I/Fs may be regarded as I/F portions receiving inputs from outside. The related I/Fs correspond to the external input terminal related to the "items strongly recommended to verify" and the driving FF of the user I/F 8*f*.

The priority setting part 43 aids the verifier to set the priority for execution of the logical simulation of the created verification items, based on the verification item data 33 and the priority table 39. The priority data 34 indicating the priority of the verification items are stored in the storage part 130.

The scenario formulation part 44 formulates a verification scenario for the logical simulation verification based on the verification item data 33 and the priority data 34. The verification scenario data 35 being formulated are stored in the storage part 130.

The verification part 45 verifies the DUT 8 by the logical simulation. A verification result is displayed at the display device 15, and a presence or absence of detection of a DUT bug is determined by the verifier. When the detection of DUT bug is confirmed, the RTL description data 32 are modified by the designer. When design contents of DUT 8 are modified, a process by the priority determination part 42 is conducted and the priority of the verification items is re-considered. In accordance with the re-considered priority of the verification items, the logical simulation verification is performed again.

The specification 31 corresponds to a data file which an operation of the DUT 8, which is described in natural language, is defined. The RTL description data 32 correspond to a data file in which the operation of the DUT 8 is described by the designer in a hardware description language based on the specification 31.

The verification item data 33 is regarded as item data for verifying the operation of the DUT 8. The priority data 34 correspond to a data file in which the priority for the verification items is indicated. The verification scenario data 35 correspond to a data file storing the verification scenario which is created so as that the logical simulation is performed with the verification item data 33 in accordance with the priority data 34.

The connection number list 36 is regarded as a list in which a connection number from the FF to the first post-stage or the connection number from a first pre-stage concerning an input to the FF for each of the FFs determined as the "items strongly recommended to verify". The input path list 37 is regarded as a list in which path information is corresponded to for each of the FF before and after the modification of the DUT 8. The priority table 39 is regarded as a list in which the related I/Fs are prioritized based on the priority of the FFs.

In FIG. 7, a verification item extraction apparatus 102 includes the verification item extraction part 41, and the priority determination part 42. The verification item extraction apparatus 102 includes data such as the specification 31, the RTL description data 32, the verification item data 33, the connection number list 36, the input path list 37, the related I/F correspondence table 38, the priority table 39, and the like. In the following, a verification item extraction process conducted by the verification item extraction apparatus 102 will be described.

Figure 8:
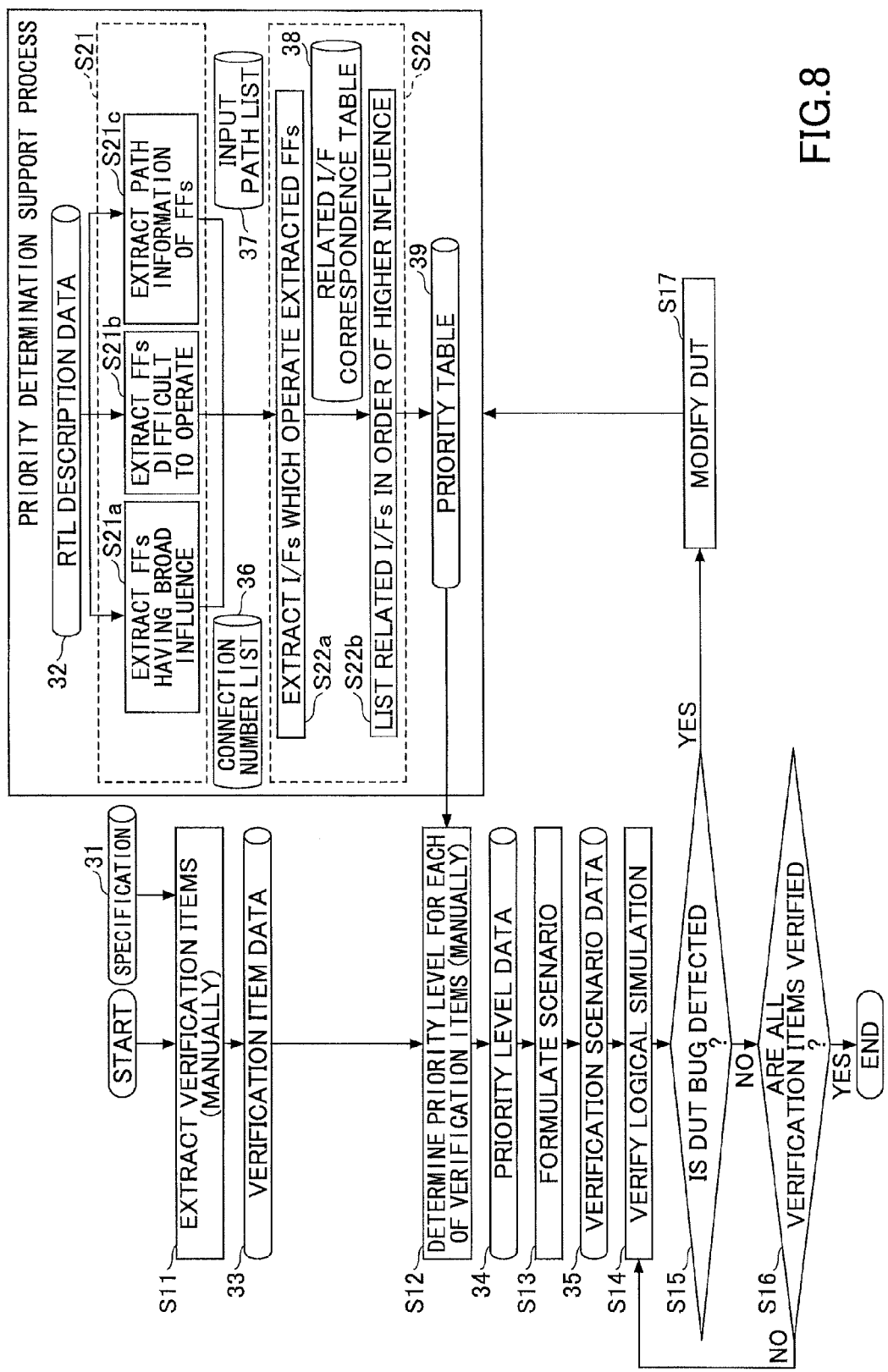
FIG. 8 is a diagram for briefly explaining the entire verification item extraction process according to the embodiment.

FIG. 8 is a diagram for briefly explaining the entire verification item extraction process according to the embodiment. In FIG. 8, the verification item extraction part 41 acquires the verification item data 33 storing the verification items which are created by the verifier based on an experience of creating the verification items, from the verifier, and stores the verification item data 33 in the storage part 130 (step S11).

On the other hand, in the priority determination part 42, the priority portion extraction part 421 extracts the "items strongly recommended to verify", that is, priority portions (step S21). An extraction process of the priority portions in step S21 conducts at least one of extracting the FFs having the broad influence from the RTL description data 32 (step S21a), extracting the FFs difficult to operate (step S21b), and extracting the path information of the FFs (step S21c). In step S21a or step S21b, the connection number list 36 is output to the storage part 130. In step S21c, the input path list 37 is output to the storage part 130.

Next, the priority determination part 42 conducts the related I/F extraction process by the related I/F extraction part 423 (step S22). The related I/F extraction part 423 extracts the interface (I/F) indicating the driving FFs of the user I/F 8f and the external input terminals (step S22a). The driving FFs and the external input terminals drive the FFs being extracted by the priority portion extraction part 421. The related I/F correspondence table 38 is stored in the storage part 130. After that, the related I/F extraction part 423 lists the related I/Fs in an order of broader influence (step S22b). The priority table 39 is stored in the storage part 130.

The priority setting part 43 displays the verification item data 33 and the priority table 39 in response to an instruction of the verifier, and sets the priority of the verification items in accordance with the instruction of the verifier (step S12). The priority data 34 are stored in the storage part 130.

The scenario formulation part 44 creates the verification scenario data 35 in the storage part 130 in accordance with the priority data 34 so as to conduct the logical simulation based on the verification item data 33 (step S13).

After that, the verification part 45 verifies the DUT 8 by the logical simulation in response to a verification instruction of the verifier (step S14). The verification part 45 determines whether a bug is detected in the DUT 8 (step S15). When the bug in the DUT 8 is detected (Yes of step S15), the verification part 45 reports a bug detection to the verifier. After the RTL description data 32 representing the operation of the DUT 8 are modified (step S17), a process is conducted by the priority determination part 42. In this case, a process in step S21c is conducted, and processes in steps S22a and 22b are conducted. Thus, the priority table 39 is updated. By using the priority table 39 being updated, processes are repeated from the above described step S12.

On the other hand, when the bug is not detected (No of step S15), the verification part 45 determines whether all verification items are processed (step S16). When all verification items are not processed (No of step S16), the logical verification apparatus 100 goes back to step S14, and the above described process are conducted.

Figure 9:
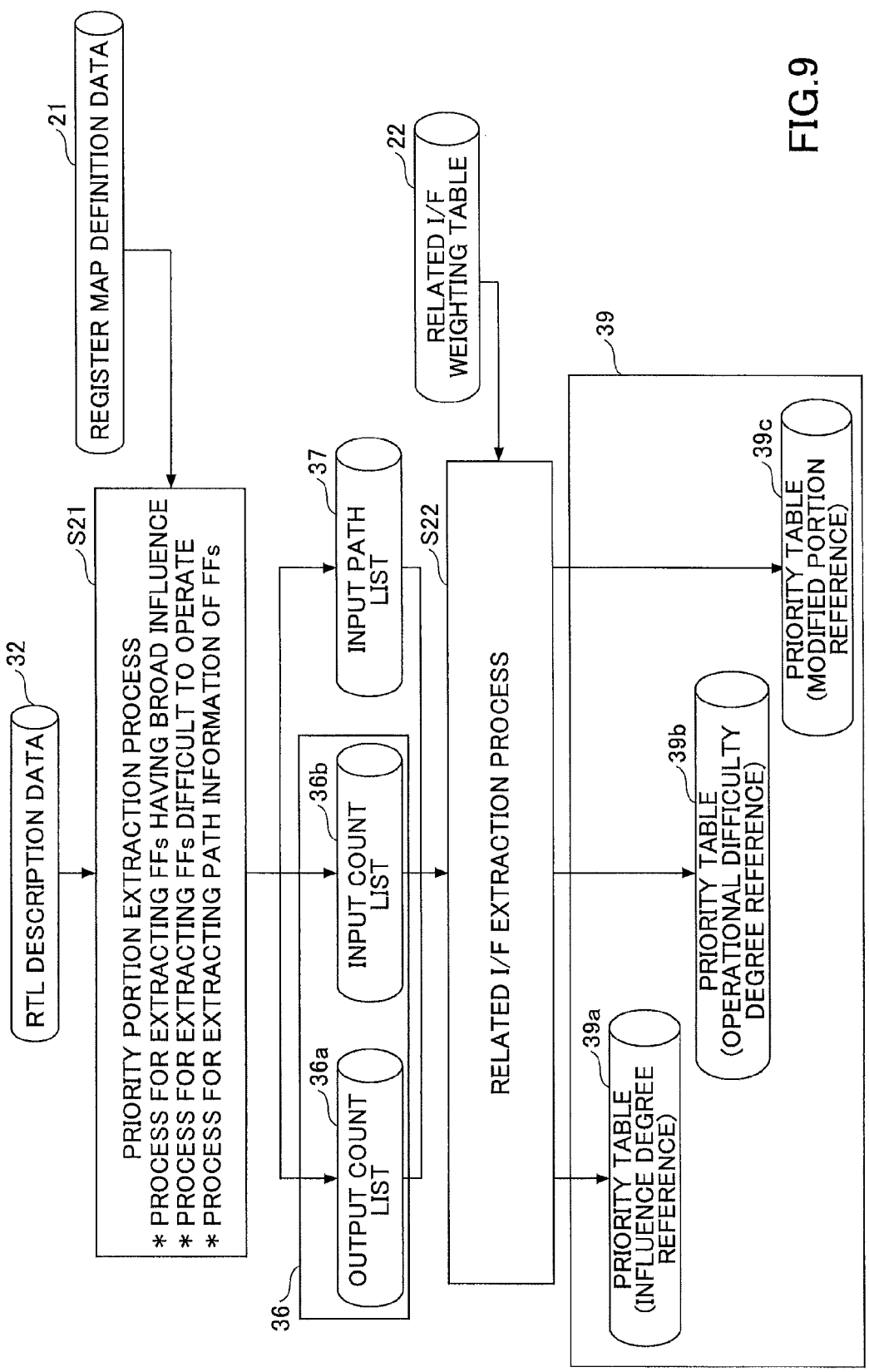
FIG. 9 is a flowchart for briefly explaining a priority determination process.

The priority determination process by priority determination part 42 will be briefly described with reference to FIG. 9. FIG. 9 is a flowchart for briefly explaining the priority determination process. In the priority determination process by priority determination part 42, a priority portion extraction process is conducted by the priority portion extraction part 421 (step S21), and a related I/F extraction process is conducted by related I/F extraction part 423 (step S22).

In the priority portion extraction process (step S21), when a process extracting the FFs having the broad influence is performed, an output count list 36a is output to the storage part 130.

By the related I/F extraction process (step S22), a priority table 39a is output to and stored in the storage part 130. In the priority table 39a, the priority is listed for each of the related I/Fs (including the external input terminals and the driving FF of the user I/F 8f) of the extracted FF. The priority table 39a indicates the priority of the related I/F on the basis of the influence degree to the post-stage of the extracted FF (an influence degree reference). When the priority is determined, the priority may be determined by weighting the related I/F by referring to a related I/F weighting table 22 which is set beforehand and defines a weight value for each of the related I/Fs.

In the priority portion extraction process (step S21), when a process is performed for extracting the FF difficult to operate, an input count list 36b is output to the storage part 130.

Next, by the related I/F extraction process (step S22), a priority table 39b is output and stored to the storage part 130. In the priority table 39b, the priority is listed for each of the related I/Fs (including the external input terminals and the driving FF of the user I/F 8f) of the extracted FF. The priority table 39b indicates the priority of the related I/F on the basis of the inputs from the pre-stage of the extracted FF (an operational difficulty degree reference). When the priority is determined, the priority may be determined by weighting the related I/F by referring to the related I/F weighting table 22 which is set beforehand and defines a weight value for each of the related I/Fs.

In the priority portion extraction process (step S21), when the process for extracting the path information of the FFs is conducted based on the RTL description data 32 and register map definition data 21, an input path list 37 is output to the storage part 130. The register map definition data 21 correspond to definition data of a register map which is created by the verifier beforehand, or definition data of the register map which is created beforehand by automatic detection by analyzing a CPU interface operation.

Then, by the related I/F extraction process (step S22), a priority table 39c is output to and stored in the storage part 130. In the priority table 39c, the priority is listed for each of the related I/Fs (including the external input terminals and the driving FF of the user I/F 8f) of the extracted FF. The priority table 39c indicates the priority of the related I/F on the basis of the extracted FF (a modified portion reference). When the priority is determined, the priority may be determined by weighting the related I/F by referring to the related I/F weighting table 22 which is set beforehand and defines the weight value for each of the related I/Fs.

Figure 10:
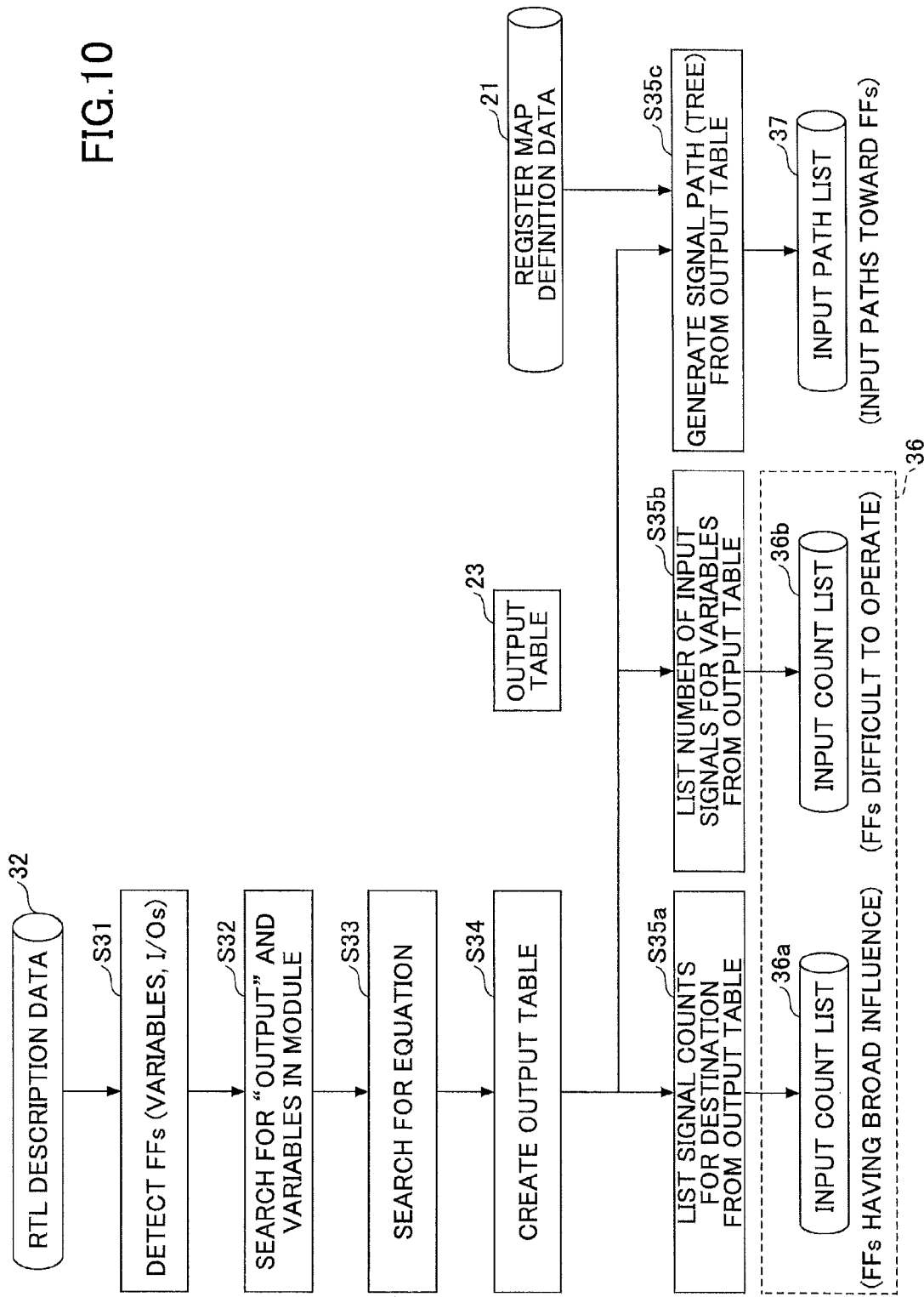
FIG. 10 is a flowchart for explaining the priority portion extraction process.

The priority portion extraction process by the priority portion extraction part 421 will be described. FIG. 10 is a flowchart for explaining the priority portion extraction process. In FIG. 10, the priority portion extraction part 421 includes a process for extracting the FFs having the broad influence, a process for extracting the FFs difficult to operate, and a process for extracting the path information of the FFs.

The priority portion extraction part 421 detects the FFs (variables representing the FFs, inputs/outputs of the FFs, and the like) from the RTL description data 32 (step S31), and searches for an "output" and variables in a module (step S32). Variable names are acquired from variable definitions such as strings "output", "input", "reg", "wire", and the like. Also, the priority portion extraction part 421 searches for an equation for generating a signal value from the RTL description data 32 (step S33). The variable names acquired in step S32 may exist in a right side of the equation.

The priority portion extraction part 421 creates an output table 23 in which results from steps S31, S32, and S33 are indicated, to the storage part 130 (step S34).

Next, the priority portion extraction part 421 lists signal numbers for destination from output table 23 (step S35a). By counting signals branched from an output signal of the FFs, the influence degree which the FF applies to the post-stage is acquired for each of the FFs. As a result, an output count list 36a is output to and stored in the storage part 130. The output count list 36a lists the FFs in the order of broader influence.

Alternatively, the priority portion extraction part 421 lists a number of the input signals for each variable from the output table 23 (step S35b). A complex degree of a driving condition of the FF is indicated by counting the input signals for each of the FFs. An input count list 36b of the complex degrees is stored in the storage part 130. The input count list 36b indicates the FFs in an order of a difficulty degree to operate the FFs.

Moreover, the priority portion extraction part 421 generates the signal paths (a tree) from the output table 23 (step S35c). The input path list 37 is stored in the storage part 130. The input path list 37 represents input paths toward the FFs by a tree structure.

In a flowchart depicted in FIG. 10, processes in steps S31, S32, S33, S34, and S35a may form a process for extracting the FFs having the broad influence. Processes in steps S31, S32, S33, S34, and S35b may form a process for extracting the FFs difficult to operate. Processes in steps S31, S32, S33, S34, and S35c may form a process for extracting the path information of the FFs.

Figure 11:
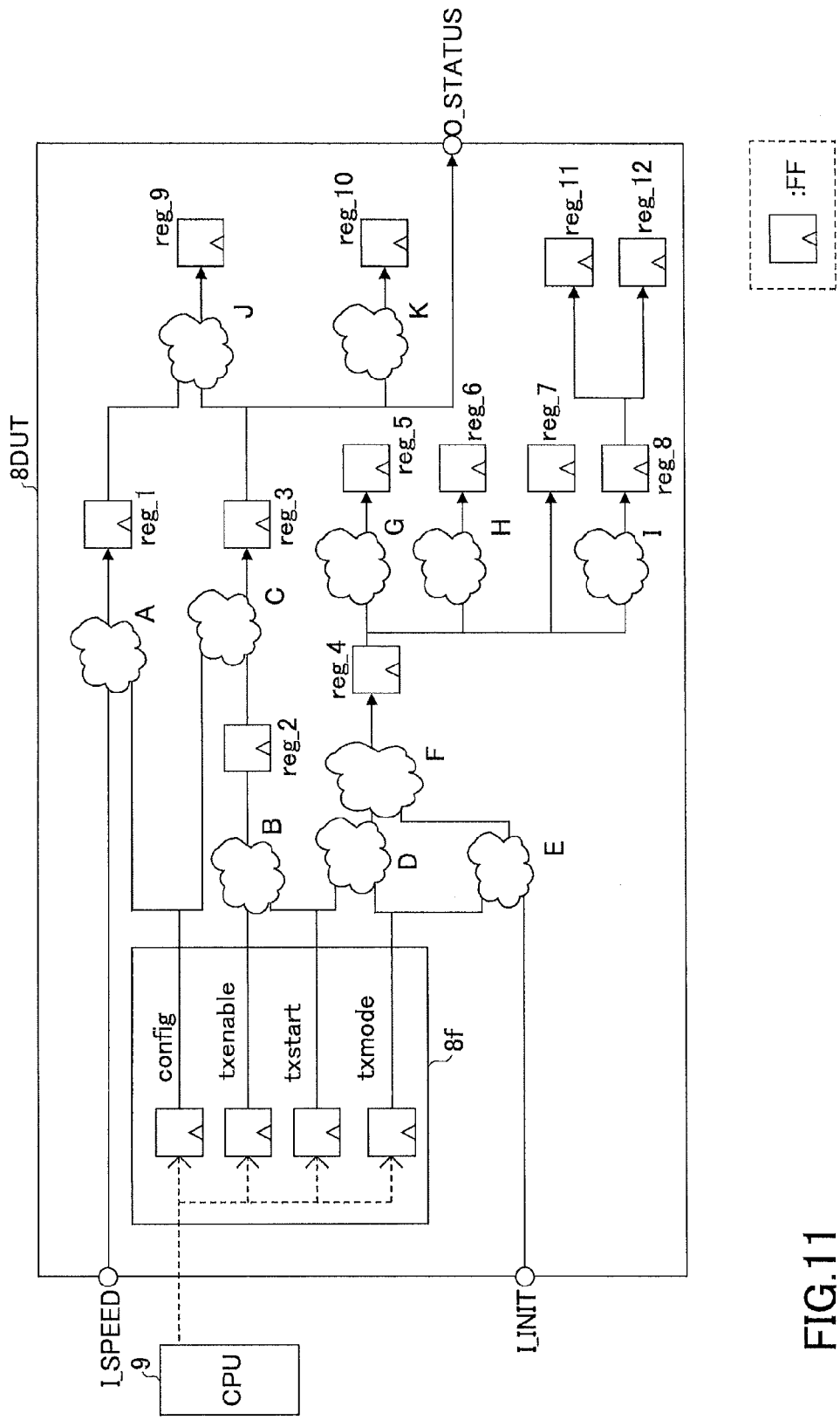
FIG. 11 is a diagram illustrating examples of variable names respective to circuit components of a DUT.

An example of the above described priority determination process will be described with reference to FIG. 11 and FIG. 12. FIG. 11 is a diagram illustrating examples of variable names respective to circuit components of the DUT 8. FIG. 12 is a diagram illustrating a RTL description example of the DUT 8. An example in FIG. 12 illustrates a RTL description described in Verilog Hardware Description Language (Verilog HDL). However, language for the RTL description is not limited by this example to the Verilog HDL.

In a process in step S31 in FIG. 10, FF information pertinent to the FFs and not-FF information other than the FF information are acquired from the RTL description data 32 (FIG. 12). In a circuit configuration of the DUT 8 in FIG. 11, signals of "config", "txstart", "txmode", and "reg_1" to "reg_12" are acquired as the FFs.

In a process in step S32 in FIG. 10, the signals (or variables), which are defined by "output", "input", "reg", and "wire", are searched for from the RTL description data 32 (FIG. 12). In the circuit configuration example of the DUT 8 in FIG. 11, "O_STATUS", "I_SPEED", "I_INIT", "config", "txenable", "txstart", "txmode", "reg_1" to "reg_12", and "A" to "K" defied as signals or variables in the RTL description data 32 (FIG. 12).

In a process in step S33 in FIG. 10, an equation for generating the signal value is searched for from the RTL description data 32 (FIG. 12). The variables acquired in step S32 may exist in the right side of the equation. In the RTL description data 32 illustrated in FIG. 12, "cpu_data[3]<=txenable" by description 201, "reg_1<=A" by description 202, "B=txenable&txstart" by description 203, "reg_2<=B" by description 204, and the like are detected.

In a process in step S34 in FIG. 10, with respect to all signals detected in step S32, the FF information and not-FF information, which are detected in step S31, are distinguished. In a case of the FF information, a FF flag is set in the output table 23. Also, all signals, which are detected in step S33 and appear in the equation for generating the signal value, are acquired.

All signals detected in step S32 and all signals detected in step S33 are listed, and the output table 23 is created in the storage part 130.

A data example of the output table 23 will be described. FIG. 13 is the data example of the output table 23. In FIG. 13, the output table 23 includes information of the FF flag, the signal, the input signal, a FF replacement, a signal after duplication elimination, and the like.

In a case in which the signal indicated in a "input signal" field is a not-FF signal (a wire or the like) in the output table 23, the priority portion extraction part 421 replaces the signal so as to form signals being FFs alone based on the input signal with respect to the not-FF signal. Replacement contents are set in a "FF replacement" field.

It is determined whether the input signal is the not-FF signal (the wire or the like). A subject signal is set in a "signal" field in any one of records. Thus, for all records of the output table 23, a presence or absence of a value in a "FF flag" field may be determined. A subject signal being retrieved is replaced with the "input signal" of the subject signal itself. Even in a result of this replacement, if there is the not-FF signal in the output table 23, the search and the replacement are similarly conducted. As a result, the "input signal" fields of all records indicate the FF signal or the external input signal.

In the output table 23 illustrated in FIG. 13, if a value of the input signal indicates a "signal" itself, the value of the input signal is eliminated from the "input signal" field. A symbol "-" indicates that the replacement from the not-FF signal (a signal defined by the "wire" by the RTL description data 32 (FIG. 12)) to the FF signal for the signal of the "input signal" field. Moreover, in the "signal after duplication elimination" field, a result from eliminating duplication of the signal is indicated for the signal of the "FF replacement" field. If there is no duplication of the signal, the symbol "-" is indicated.

In the output table 23, since "Top.A" is the not-FF signal, the FF replacement is performed by setting a value "Top.I_SPEED, Top.regblok.config" in the "input signal" field of a record where "Top.A" is indicated in the "signal" field to the "FF replacement" field of a record where "Top.A" is set in the "input signal" field. In a case in which the not-FF signal is set in the "input signal" field in another record, the FF replacement is conducted in the same manner.

A process in step S35a for listing the FFs in the order of the broad influence will be described. FIG. 14 is a diagram illustrating a data example of the output count list 36a. The output count list 36a illustrated in FIG. 14 includes fields of a FF flag, a signal, an input signal, an appearance count in the "input signal" field, and the like.

In a record in which the "FF flag" field of the output table 23 illustrated in FIG. 13 indicates the FF, a signal set in the "signal" field (hereinafter, called "FF signal") is counted if the signal appears in the "input signal" field. The output count list 36a is regarded as a list in which a count result is set in the "appearance count in "input signal"" field.

In a record in which the FF is indicated in the "FF flag" field, if an appearance of "Top.reg_3" in the "input signal" field is counted and a count result "2" is acquired, the count result "2" is set to the "appearance count in "input signal"" field of a record where "Top.reg_3" is set in the "signal" field.

If the appearance of "Top.reg_4" in the "input signal" field is counted and a count result "4" is acquired, the count result "4" is set to the "appearance count in "input signal"" of a record where "Top.reg_4" is set in the "signal" field. A similar process is conducted or each of records, and a value is set in the "appearance count in "input signal"" field.

By referring to the output count list 36a, it is possible to acquire the indicator of greatness of the influence of the FF with respect to other FFs in the RTL description data 32, for each of the FFs described in the RTL description data 32.

A process in step S35b for listing the FFs in the order of the difficulty degree to operate the FFs will be described. FIG. 15 is a diagram illustrating a data example of the input count list 36b. The input count list 36b illustrated in FIG. 15 includes fields of a FF flag, a signal, an input signal, a signal count in "input signal", and the like.

A signal set in the "input signal" field is counted in records where the "FF flag" field in the output table 23 illustrated in FIG. 13 indicates the FF. The input count list 36b is regarded as a list in which a count result is set in the "appearance count in "input signal"" field.

In records where the FF is indicated in the "FF flag" field, if a signal indicated in the "input signal" field is counted for records where the "signal" field indicates "Top.reg_1", a result "2" is acquired. The result "2" is set to the "appearance count in "input signal"" field. For each of records, a similar process is conducted, and a value is set to the "appearance count in "input signal"" field.

By referring to the output count list 36b, it is possible to acquire the indicator of the difficulty degree to operate in a case of operating the FF from other FFs in the RTL description data 32 for each of the FFs described in the RTL description data 32.

A process in step S35b for listing sets of path information of the FFs will be described. FIG. 16 is a diagram illustrating a data example of the input path list 37. The input path list 37 illustrated in FIG. 16 includes fields of a FF flag, a signal, an input signal, a path from related I/F, and the like.

In records where the "FF flag" field indicates the FF in the output table 23 illustrated in FIG. 16, a record_a indicating a FF signal in the "input signal" field is searched for. If the record_a is searched, the input signals are listed in accordance with the input path indicated in the "path from related I/F" field.

Each of input signals listed in the "path from related I/F" field is searched for from the "signal" field of a record_b where the "FF flag" field indicates the FF. After that, the FF signal indicated in the "input signal" field of the searched record_b is set in the "path from related I/F" field of the record_a so as to indicate a path sequence.

The above described process is repeated until the paths of the input signal (the tree) are listed in the "path from related I/F" on the basis of the external input terminals and the driving FFs of the user I/F 8f. Information of the driving FFs of the user I/F 8f is acquired from the register map definition data 21. When reaching the driving FF of the user I/F 8f, an iterative process for tracing back the path is terminated.

By referring to the input path list 37 acquired by the above described process, if a part of the RTL description data 32 is modified, it is possible to acquire information of the related I/F pertinent to a modified FF, such as the external input terminals and the driving FF of the user I/F 8f influencing the modified FF.

The related I/F extraction process performed by the related I/F extraction part 423 will be described. FIG. 17 is a flowchart for explaining the related I/F extraction process. In FIG. 17, each of cases will be described; a case for determining the priority on the basis of the influence degree, a case for determining the priority on the basis of the difficulty degree to operate, and a case for determining the priority on the basis of a modified portion. FIG. 18 is a diagram illustrating a data example of the related I/F correspondence table 38a.

In the case for determining the priority on the basis of the influence degree, the related I/F extraction part 423 creates the related I/F correspondence table 38a in the storage part 130 based on the output count list 36a (step S41).

As illustrated in FIG. 18, the related I/F correspondence table 38a includes fields of a FF flag, a signal, an appearance count in the "input signal" field, a related I/F, a score of related I/F, an accumulated score, and the like. Values of the "FF flag" field and the appearance count in the "input signal" field in the output count list 36a are set in those fields in the related I/F correspondence table 38a.

The related I/F extraction part 423 acquires information of the related I/F driving each of the FF signals from the "path from the related I/F" field of the input path list 37, and lists it in the "related I/F" field of the related I/F correspondence table 38a.

Next, the related I/F extraction part 423 scores the related I/F (step S42). The related I/F extraction part 423 sets a value of the "appearance count in the "input signal"" field for the FF in the related I/F correspondence table 38a, to the "score of related I/F" field by corresponding to each of the signals listed in the "related I/F" field.

Regarding the FF for which a count "n" is indicated in the "appearance count in the "input signal"" field, the count "n" is set to the "score of related I/F" field by corresponding to each of signals listed in the "related I/F" field.

That is, in a record setting "Top.reg_1" in the "signal" field, a count "1" indicated in the "appearance count in the "input signal"" field is set in the "score of related I/F" field by corresponding to each of "Top.I_SPEED" and "Top.regblk. config" listed in the "related I/F" field.

Also, in a record setting "Top.reg_2" in the "signal" field, a count "1" indicated in the "appearance count in the "input signal"" field is set in the "score of related I/F" field by corresponding to each of "Top.regblk.txenable" and "Top.regblk.txstart" listed in the " " field.

Similarly, for a record setting "Top.reg_3" in the "signal" field, a count "2" is set in the "related I/F" field for each of signals. For a record setting "Top.reg_4" in the "signal" field, a count "4" is set in the "related I/F" field for each of signals.

For multiple records setting the FF in the "FF flag" field, a value accumulating the scores of the related I/F in an appearance order is set to the "accumulated score" field with respect to the signal which appears in the "related I/F" field. By accumulating the scores, a total score of the related I/F driving the multiple FFs having greater influence becomes greater.

For example, in a record setting "Top.reg_3" in the "signal" field, by adding a value "2" in the "score of related I/F" field corresponding to "Top.regblk.txstart" listed in the "related I/F" field and a value "1" in the "accumulated score" field corresponding to "Top.regblk.txstart" which appears prior to this record, a value "3" is set to the "accumulated score" field of this record.

Furthermore, in a record setting "Top.reg_4" in the "signal" field, by adding a value "4" in the "score of related I/F" field corresponding to "Top.regblk.txstart" listed in the "related I/F" field and a value "3" in the "score of related I/F" field corresponding to "Top.regblk.txstart" which appears prior to this record, a value "7" is set to the "accumulated score" field of this record.

Accordingly, "Top.regblk.txstart" is listed in each of records indicating "Top.reg_2", "Top.reg_3", and "To.reg_4", and values "1", "2", and "4" are set to the respective "score of related I/F" field. In a last record where "Top.regblk.txstart" appears in the "related I/F" field, a value "7" is set to the "accumulated score" field. The total score of "Top.regblk.txstart" becomes "7". A process for setting the "accumulated score" field is conducted for each of signals which appear in the "related I/F" field.

After that, the related I/F extraction part 423 sorts the accumulated score of the related I/F (step S43). In all records of the related I/F correspondence table 38a, a greatest accumulated score is acquired for the same signal appearing in the "related I/F" field, and the signals are sorted by the acquired greatest accumulated scores.

In a case of using a sorting result as the priority, if the appearance count in the "related I/F" is greater for a signal of the related I/F (hereinafter, simply called "related I/F"), the priority of that signal becomes higher. However, that signal may not be a signal to be considered so much as the verification items. A scan test signal, a reset signal, and the like may correspond to that signal, so that they may not be items to verify with higher priority.

The related I/F extraction part 423 adjusts the accumulated score of the related I/F by referring to the related I/F weighting table 22 (step S45). The related I/F extraction part 423 acquires a related I/F weight which is defined by the verifier or the designer, and acquires a adjustment value by multiplying the accumulated score of the related I/F with the related I/F weight.

By the related I/F extraction part 423, the priority table 39a is created on the basis of the influence degree as illustrated in FIG. 19, and is stored in the storage part 130. FIG. 19 is a diagram illustrating a data example of the priority table 39a on the basis of the influence degree. In FIG. 19, the priority table 39a includes fields of a related I/F, an accumulated score, a weight, an adjustment value, and the like.

For the priority table 39a, a record is created for each of signals appearing in the "related I/F" field in all records of the related I/F correspondence table 38a. In the priority table 39a, a signal specified as the related I/F is indicated in the "related I/F" field, and the greatest accumulated score is set in the "accumulated score" field.

The priority based on the accumulated scores indicates an order of "Top.regblk.txstart" (highest priority), "Top.regblk.txmode", "Top.I_INT", "Top.regblk.txenable", "Top.regblk.config", "Top.I_SPEED" (lower priority), . . . .

On the other hand, after weighting the accumulated scores, the priority indicates an order of "Top.regblk.txstart" (highest priority), "Top.regblk.txmode", "Top.regblk.txenable", "Top.I_INT", "Top.regblk.config", "Top.I_SPEED" (lower priority), . . . , in which "Top.I_INT" is switched with "Top.regblk.txenable".

As described above, the priority table 39a is created, and is displayed at the display device 15. The indicator of the greatness of the influence based on the RTL description data 32 is indicated for the related I/F. Accordingly, it is possible for the verifier or the designer to effectively determine the priority of the verification items.

In a case of confirming the scores of the related I/Fs as the external input terminals and the FFs of the user I/F 8f used for each of the verification items with respect to the verification items which are manually created, it is possible for the verifier or the designer to use the indicator as one of criteria for determining the verification items in which the influence degree is the priority.

Next, in a case of determining the priority on the basis of difficulty degree to operate, the related I/F extraction part 423 creates a related I/F correspondence table 38b based on the input count list 36b (step S51).

As illustrated in FIG. 20, the related I/F correspondence table 38b includes fields of a FF flag, a signal, a signal count in "input signal", a related I/F, a score of related I/F, an accumulated score, and the like. Values set in the "FF flag" field and the "signal count in "input signal"" field are set to the same fields in the related I/F correspondence table 38b.

The related I/F extraction part 423 acquires information of the related I/F for driving each of the FF signals from the "path from related I/F" field of the input path list 37, and lists the information in the "related I/F" field of the related I/F correspondence table 38b.

Next, the related I/F extraction part 423 scores the related I/F (step S52). The related I/F extraction part 423 sets a value of the "signal count in "input signal"" field for each of the FFs of the related I/F correspondence table 38b to the "score of the related I/F" field by corresponding to each of signals listed in the "related I/F" field.

Regarding the FF for which a count "n" is indicated in the "signal count in the "input signal"" field, the count "n" is set to the "score of related I/F" field by corresponding to each of signals listed in the "related I/F" field.

That is, in a record setting "Top.reg_1" in the "signal" field, a count "2" indicated in the "signal count in the "input signal"" field is set in the "score of related I/F" field by corresponding to each of "Top.I_SPEED" and "Top.regblk.config" listed in the "related I/F" field.

Also, in a record setting "Top.reg_2" in the "signal" field, a count "2" indicated in the "signal count in the "input signal"" field is set in the "score of related I/F" field by corresponding to each of "Top.regblk.txenable" and "Top.regblk.txstart" listed in the " " field.

Similarly, for a record setting "Top.reg_3" in the "signal" field, a count "2" is set in the "related I/F" field for each of signals. For a record setting "Top.reg_4" in the "signal" field, a count "3" is set in the "related I/F" field for each of signals.

For multiple records setting the FF in the "FF flag" field, a value accumulating the scores of the related I/F in an appearance order is set to the "accumulated score" field with respect to the signal which appears in the "related I/F" field. By accumulating the scores, a total score of the related I/F pertinent to the FFs being difficult more to operate becomes greater.

For example, in a record setting "Top.reg_3" in the "signal" field, by adding a value "2" in the "score of related I/F" field corresponding to "Top.regblk.txstart" listed in the "related I/F" field and a value "2" in the "accumulated score" field corresponding to "Top.regblk.txstart" which appears prior to this record, a value "4" is set to the "accumulated score" field of this record.

Furthermore, in a record setting "Top.reg_4" in the "signal" field, by adding a value "3" in the "score of related I/F" field corresponding to "Top.regblk.txstart" listed in the "related I/F" field and a value "4" in the "score of related I/F" field corresponding to "Top.regblk.txstart" which appears prior to this record, a value "7" is set to the "accumulated score" field of this record.

Accordingly, "Top.regblk.txstart" is listed in each of records indicating "Top.reg_2", "Top.reg_3", and "To.reg_4", and values "2", "4", and "7" are set to the respective "score of related I/F" field. In a last record where "Top.regblk.txstart" appears in the "related I/F" field, a value "7" is set to the "accumulated score" field. The total score of "Top.regblk.txstart" becomes "7". A process for setting the "accumulated score" field is conducted for each of signals which appear in the "related I/F" field.

After that, the related I/F extraction part 423 sorts the accumulated score of the related I/F (step S53). In all records of the related I/F correspondence table 38b, a greatest accumulated score is acquired for the same signal appearing in the "related I/F" field, and the signals are sorted by the acquired greatest accumulated scores.

Due to the same reason as the case for determining the priority on the basis of the influence degree, the weight may be applied for each of the related I/Fs.

The related I/F extraction part 423 adjusts the accumulated score of the related I/F by referring to the related I/F weighting table 22 (step S55). The related I/F extraction part 423 acquires a related I/F weight which is defined by the verifier or the designer, and acquires an adjustment value by multiplying the accumulated score of the related I/F with the related I/F weight.

By the related I/F extraction part 423, the priority table 39$a$ is created on the basis of the influence degree as illustrated in FIG. 21, and is stored in the storage part 130. FIG. 21 is a diagram illustrating a data example of the priority table 39$b$ on the basis of the difficulty degree to operate. In FIG. 21, similar to the priority table 39$a$, the priority table 39$b$ includes fields of a related I/F, an accumulated score, a weight, an adjustment value, and the like.

For the priority table 39$b$, a record is created for each of signals appearing in the "related I/F" field in all records of the related I/F correspondence table 38$b$. In the priority table 39$b$, a signal specified as the related I/F is indicated in the "related I/F" field, and the greatest accumulated score is set in the "accumulated score" field.

The priority based on the accumulated scores indicates an order of "Top.regblk.txstart" (highest priority), "Top.regblk.txmode", "Top.regblk.config", "Top.I_INT", "Top.regblk.txenable", "Top.I_SPEED" (lower priority), . . . .

On the other hand, after weighting the accumulated scores, the priority indicates an order of "Top.regblk.txstart" (highest priority), "Top.regblk.txenable", "Top.regblk.txmode", "Top.I_INT", "Top.regblk.config", "Top.I_SPEED" (lower priority), . . . , in which "Top.regblk.config" is a lower priority than "Top.regblk.txmode".

As described above, the priority table 39$b$ is created, and is displayed at the display device 15. The indicator of the difficulty greatness to operate based on the RTL description data 32 is indicated for the related I/F. Accordingly, it is possible for the verifier or the designer to effectively determine the priority of the verification items.

In a case of confirming the scores of the related I/Fs as the external input terminals and the FFs of the user I/F 8$f$ used for each of the verification items with respect to the verification items which are manually created, it is possible for the verifier or the designer to use the indicator as one of criteria for determining the verification items in which the difficulty greatness to operate is the priority.

Next, in the case of determining the priority on the basis of the modified portion, the related I/F extraction part 423 creates input path tree information 37-1 in the storage part 130 (step S61). The input path tree information 37-1 indicates an input path for each of the FFs by the tree structure based on the input path list 37 (step S61).

As illustrated in FIG. 22, the input path tree information 37-1 includes fields of a FF flag, a signal, an input signal (FF at $1^{st}$ pre-stage), a FF at $2^{nd}$ pre-stage, a $3^{rd}$ pre-stage, and the like. The values set in the "FF flag" field and the "signal" field of the input path list 37 are set in the same fields of the input path tree information 37-1.

The related I/F extraction part 423 acquires information of the input signal at the pre-stage for driving each of the FFs from the "input signal" field of the input path list 37, and sets the acquired information to the input signal (FF at $1^{st}$ pre-stage)" field.

Also, the related I/F extraction part 423 sets the input signal for the signal set in the input signal for the signal, which is set in the "input signal (FF at $1^{st}$ pre-stage)" fields, to the "FF $2^{nd}$ pre-stage" field in accordance with a value of the "path from related I/F" field of the input path list 37. The related I/F extraction part 423 sets the input signal for the signal, which is set in the "FF at $2^{nd}$ pre-stage" field, to the "$3^{rd}$ pre-stage" field.

As another setting method of the signal path, a link to a signal at the pre-stage may be set. For instance, "Top.reg_2" is indicated as an input for "Top.reg_3". In the input path tree information 37-1, "Top.reg_2" in the "input signal (FF at $1^{st}$ pre-stage)" for "Top.reg_3" in the "signal" field may be linked to "Top.reg_2" in the "signal" field.

In a case of modifying the logic of the RTL description data 32, the input path tree information 37-1 is re-created. By comparing the input path tree information 37-1 with previous input path tree information 37-2 which is previously created, it is possible to acquire the modified portion in the RTL description data 32, and information of the related I/Fs which are the external input terminals and the FFs of the user I/F 8$f$ for driving the modified logic.

For instance, as a result from comparing the input path tree information 37-1 after modifying the logic with previous input path tree information 37-2 which is previously created, if a difference for "Top.reg_2" is indicated in this table, it is possible to understand to operate "Top.regblk.txenable" and "Top.regblk.txstarts".

Next, a comparison between the embodiment and a related art case will be described by using an example. By using the circuit configuration of the DUT 8 in FIG. 11, a case will be explained, in which the priority of the verification items is determined on the basis of the influence degree of the FFs inside the DUT 8 by using the RTL description data 32.

In the related art case, items are extracted based on a specification and a usage method of a circuit. Specifically, a value of a signal to apply and operations which are expected when the value of the signal is applied are extracted based on descriptions of a register map and an external terminals.

For example, it is assumed that each of register fields in a circuit diagram of the specification 31 is defined as follows:
config:(Read/Write) indicates the FF for selecting a format of a data packet
txenable:(Read Only) indicates a state in which data transmission is available
txstart:(Write Only) begins the data transmission by one set
tx_mode:(Read/Write) selects a transmission mode or a receiver mode (1: transmission mode, 0: receiver mode)
Also, as a normal procedure, the following flow is defined:
(C1) select transmission by tx_mode,
(C2) select a type of the data packet to send by config,
(C3) wait until the transmission becomes available while confirming txenable, and
(C4) start the transmission by a txstart writing after setting data.

In this case, a conventional priority of verification items may be determined based on opinions of the designer and the like as follows:
(D1) test whether an expected operation is conducted in a normal usage in accordance with a flow,
(D2) test whether an error is accurately detected when a wrong value is applied to config or data,
(D3) test whether an error is accurately detected when a wrong operation is conducted such as the txstart writing in receiving data, and
(D4) conduct an illegality test to dynamically switch tx_mode which is not originally permitted, after confirming the expected operation by performing the above (D1) to (D3) for each of tests for sending data and receiving data, so as to test a corner case.

In a case of using the above described detection method, if there is a critical bug which may occur due to usage of tx_mode of a generation circuit of reg_4, the critical bug has not been detected until (D4) is conducted. In addition, since reg_4 influences multiple logics at the port-stage, various influences may be caused by modification.

On the other hand, in a case of applying the embodiment, before reg_4 is detected, it is possible to comprehend that reg_4 corresponds to the "FF having multiple destinations and great influence", and also corresponds to the FF being driven by tx_mode. That is, it is possible to understand that tx_mode is the driving FF of the FF having the great influence.

Therefore, it may be determined to perform the illegality test dynamically switching txmode at an initial verification immediately after the above (D1). It is possible to determine the priority of the verification items so that the critical bug existing in the generation circuit of reg_4 is detectable at an initial stage.

Figure 23:
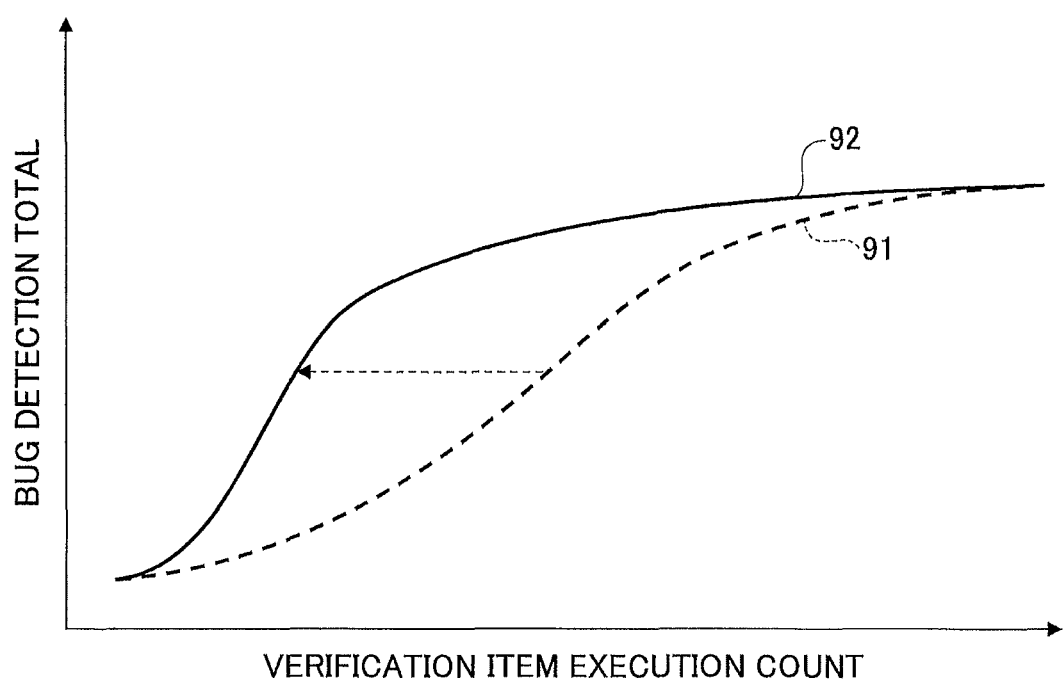
FIG. 23 is a graph illustrating a comparison between the embodiment and a related art case.

FIG. 23 is a graph illustrating a comparison between the embodiment and the related art case. In FIG. 23, a graph is depicted to indicate a bug detection total depending on verification progress. A vertical axis indicates the bug detection total, and a horizontal axis indicates a detection item execution count. An execution count of the verification times is accumulated depending on the verification progress, and a detection total of bugs depending on the execution count.

In a related art 91, few bugs are initially detected. However, when the verification has progressed more, more bugs are detected. The verification items pertinent to a bug having the great influence may be performed in a second half of the verification.

In a case in which the bug is detected, in addition to a term of a modification work for the specification 31 or the RTL description data 32, the verification items, which are conducted until the bug is detected, are considered again. When the bug having the great influence is detected later in the verification work, a schedule of the entire verification may be influenced more. If the bug is detected at the second half of the verification work, a schedule corresponding to the bug becomes difficult at a design section. Then, the verification work may be interrupted.

Moreover, in a case of re-conducting the verification, there is no indicator specifying a verification item corresponding to the peripheral logic to which the modification of the RTL description data 32 influences. Hence, all verification items are re-considered, and this re-consideration influences the schedule of the entire verification.

On the other hand, in an embodiment 92, the bugs are detected more in a first half of the verification where an execution achievement of the verification items is smaller. By performing the verification items pertinent to the bugs having the great influence, it is possible to mostly detect failures of the DUT 8 in the second half of the detection. Even if the DUT 8 is modified, it is possible to reduce the number of verification items to be re-considered.

According to the embodiment it is possible to effectively set the priority of the verification items for the logical simulation of the semiconductor integrated circuit.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A logical verification apparatus, comprising:
a processor; and
a storage part configured to store description data which describe an operation of a verification subject circuit,
a display part configured to display a result from verifying the verification subject circuit by using a logical simulation by the processor,
wherein the processor performs a logical verification process including:
deriving connection relationships pertinent to an input/output for each of a plurality of logic circuits in the verification subject circuit based on connection information of the verification subject circuit acquired from the description data in the storage part;
determining a first priority used for verifying the plurality of logic circuits by using the logic simulation based on the connection relationships being derived, in which the first priority is determined by acquiring a first number of first influenced logic circuits other than a first logic circuit when the first logic circuit is modified, in the plurality of the logic circuits;
extracting a plurality of related I/F circuits, which are related to input paths to each of the logic circuits and are interface parts between the verification subject circuit and an outside of the verification subject circuit, based on the connection information; and
determining a second priority used for verifying the plurality of related I/F circuits by the logical simulation based on the first priority;
displaying the first priority and the second priority at the display part;
inputting a priority order of a verification determined based on the first priority and the second priority being displayed at the display part, and verification items of the verification using the logical simulation; and
verifying the verification subject circuit by the logical simulation based on the priority order being input.

2. The logical verification apparatus as claimed in claim 1, wherein in the verification process, the processor creates a connection count list in the storage part by extracting input information and output information for each of the plurality of logic circuits from the description data, wherein
the input information indicates a plurality of input signals to input to the plurality of logic circuits and a number of the plurality of input signals, and
the output information indicates a plurality of destination logic circuits to be output destinations of the logics and a number of the plurality of destination logics.

3. The logical verification apparatus as claimed in claim 2, wherein in the logical verification process, the processor
counts a plurality of post-logic circuits connected to a first post-stage of outputs of a logic circuit for each of the plurality of logic circuits by referring to the connection count list from the storage part, and
determines the first priority based on a post-logic count result.

4. The logical verification apparatus as claimed in claim 2, wherein in the logical verification process, the processor
counts a plurality of signals being combined with inputs of the plurality of logic circuits by referring to the connection count list for each of the plurality of logic circuits from the storage part, and
determines the first priority based on a signal count result.

5. The logical verification apparatus as claimed in claim 2, wherein in the logical verification process, the processor extracts input paths of signals to each of the plurality of logic circuits by referring to the connection count list from the storage, and creates a list which indicates a plurality of modified logic circuits and, the input signals and the logics included in the related I/F circuits driving the modified logic circuits by comparing the input paths before and after the description data are modified.

6. The logical verification apparatus as claimed in claim 2, wherein in the logical verification process, the processor extracts the plurality of related I/F circuits related to the logic circuit by tracing back connections at an input side of the logic with respect to each of the plurality of logic circuits described in the description data based on the connection information acquired from the description data stored in the storage part, and determines the second priority based on a total value acquired by accumulating values of the first priority of the logics being driven a plurality of by extracted related I/F circuits.

7. The logical verification apparatus as claimed in claim 1, further comprising acquiring, based on the connection relationships, a second number of second influenced logic circuits other than a second logic circuit when the second logic circuit different from the first logic circuit is modified, in the plurality of the logic circuits, wherein the first priority is determined based on the first number and the second number.

8. A logical verification method performed in a computer, the method comprising:

acquiring, by the computer, connection information from description data which describe an operation of a verification subject circuit and are stored in a storage part;

deriving, by the computer, connection relationships pertinent to an input/output for each of a plurality of logic circuits in the verification subject circuit based on connection information of the verification subject circuit acquired from the description data in the storage part;

determining, by the computer, a first priority used for verifying the plurality of logic circuits by using the logical simulation based on the connection relationships being derived, in which the first priority is determined by acquiring a first number of first influenced logic circuits other than a first logic circuit when the first logic circuit is modified, in the plurality of the logic circuits;

extracting, by the computer, a plurality of related I/F circuits, which are related to input paths to each of the plurality of logic circuits and are interface parts between the verification subject circuit and an outside of the verification subject circuit, based on the connection information;

determining, by the computer, a second priority used for verifying the plurality of related I/F circuits by the logical simulation based on the first priority;

displaying, by the computer, the first priority and the second priority at a display part;

inputting, by the computer, a priority order of a verification determined based on the first priority and the second priority being displayed at the display part, and verification items of the verification using the logical simulation; and verifying, by the computer, the verification subject circuit by the logical simulation based on the priority order being input.

9. A non-transitory computer-readable recording medium storing a program which, when executed by a computer, causes the computer to perform a logical verification process, the process comprising:

acquiring, by the computer, connection information from description data which describe an operation of a verification subject circuit and are stored in a storage part;

deriving, by the computer, connection relationships pertinent to an input/output for each of a plurality of logic circuits in the verification subject circuit based on connection information of the verification subject circuit acquired from the description data in the storage part;

determining, by the computer, a first priority used for verifying the plurality of logic circuits by using the logical simulation based on the connection relationships being derived, in which the first priority is determined by acquiring a first number of first influenced logic circuits other than a first logic circuit when the first logic circuit is modified, in the plurality of the logic circuits;

extracting, by the computer, a plurality of related I/F circuits, which are related to input paths to each of the circuits and are interface parts between the verification subject circuit and an outside of the verification subject circuit, based on the connection information;

determining, by the computer, a second priority used for verifying the related I/F circuits by the logical simulation based on the first priority;

displaying, by the computer, the first priority and the second priority at a display part;

inputting, by the computer, a priority order of a verification determined based on the first priority and the second priority being displayed at the display part, and verification items of the verification using the logical simulation; and verifying, by the computer, the verification subject circuit by the logical simulation based on the priority order being input.

* * * * *

UNITED STATES PATENT AND TRADEMARK OFFICE
CERTIFICATE OF CORRECTION

Page 1 of 1

PATENT NO.         : 8,990,747 B2
APPLICATION NO.    : 14/244483
DATED              : March 24, 2015
INVENTOR(S)        : Motoya Tanigawa et al.

It is certified that error appears in the above-identified patent and that said Letters Patent is hereby corrected as shown below:

In the Claims

Column 20, Line 27, In Claim 1, after "information;" delete "and".

Signed and Sealed this
Eighteenth Day of August, 2015

Michelle K. Lee
*Director of the United States Patent and Trademark Office*